United States Patent
Iwamoto

(10) Patent No.: US 9,602,089 B2
(45) Date of Patent: Mar. 21, 2017

(54) AMPLIFYING DEVICE AND OFFSET VOLTAGE CORRECTION METHOD

(71) Applicant: FUJI ELECTRIC CO., LTD., Kawasaki-shi (JP)

(72) Inventor: Motomitsu Iwamoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/942,807

(22) Filed: Nov. 16, 2015

(65) Prior Publication Data

US 2016/0164467 A1    Jun. 9, 2016

(30) Foreign Application Priority Data

Dec. 5, 2014    (JP) ................................. 2014-246618

(51) Int. Cl.
*H03K 5/007*    (2006.01)
*H03F 3/45*    (2006.01)

(52) U.S. Cl.
CPC ......... *H03K 5/007* (2013.01); *H03F 3/45183* (2013.01); *H03F 3/45744* (2013.01); *H03F 2200/228* (2013.01); *H03F 2200/375* (2013.01)

(58) Field of Classification Search
CPC .................................................. H03F 3/45892
USPC ..................................... 330/9; 327/124, 307
See application file for complete search history.

(56) References Cited

U.S. PATENT DOCUMENTS

| 6,756,924 B2* | 6/2004 | Lee ..................... H03F 3/45995 327/307 |
| 7,109,697 B1 | 9/2006 | Atrash et al. |
| 7,236,117 B1* | 6/2007 | Varma ................. H03M 1/1028 341/122 |
| 8,102,203 B2* | 1/2012 | Drost .................. H03F 3/45973 330/9 |
| 8,289,197 B2* | 10/2012 | Nakamoto ........... H03K 5/2481 341/117 |
| 2003/0214423 A1* | 11/2003 | Lee ..................... H03F 3/45995 341/118 |

FOREIGN PATENT DOCUMENTS

WO    WO-2007/002944 A2    1/2007

* cited by examiner

*Primary Examiner* — Henry Choe
(74) *Attorney, Agent, or Firm* — Rabin & Berdo, P.C.

(57) ABSTRACT

A state wherein offset voltage is reduced can be maintained regardless of environmental fluctuation. A differential amplification unit has differential pair transistors, and amplifies a difference between input voltages. An offset voltage measurement unit samples offset voltage generated due to an imbalance in the current drive capacities of the differential pair transistors in a first mode, and determines the polarity of the sampled offset voltage in a second mode. A control unit switches the operating mode between the first mode and second mode, and outputs a control signal for correcting the offset voltage in accordance with the polarity determination result when in the second mode. An offset voltage correction unit corrects the offset voltage based on the control signal.

12 Claims, 16 Drawing Sheets

FIRST MODE — SAMPLING

SECOND MODE — POLARITY DETERMINATION AND CORRECTION

Voffset1 NEGATIVE OFFSET VOLTAGE
OFFSET VOLTAGE CORRECTION

Voffset2 POSITIVE OFFSET VOLTAGE
OFFSET VOLTAGE CORRECTION

| | trim[6] | trim[5] | trim[4] | trim[3] | trim[2] | trim[1] |
|---|---|---|---|---|---|---|
| OFFSET VOLTAGE CORRECTION AMOUNT | +4mV | +2mV | +1mV | −4mV | −2mV | −1mV |

FOR NEGATIVE OFFSET VOLTAGE CORRECTION

FOR POSITIVE OFFSET VOLTAGE CORRECTION

AMPLIFYING DEVICE AND OFFSET VOLTAGE CORRECTION METHOD

CROSS-REFERENCE TO RELATED APPLICATION

This application is based on, and claims priority to, Japanese Patent Application No. 2014-246618, filed on Dec. 5, 2014, contents of which are incorporated herein by reference.

BACKGROUND OF THE INVENTION

1. Field of the Invention

The present invention relates to an amplifying device and offset voltage correction method.

2. Description of the Background Art

In a differential amplification circuit, imbalance normally occurs in current flowing through the circuit due to a mismatch in differential pair transistor characteristics or the characteristics of an active load connected to the differential pair transistors, and offset voltage arising from the current imbalance is generated. When the offset voltage is high, it may cause error and affect the circuit operation, because of which offset voltage reduction is carried out.

For example, an amplification circuit wherein differing fixed reference voltages are applied to the differential pair transistors, and offset voltage is uniformized over a predetermined temperature range based on bias current output from one transistor of the differential pair, has been proposed as existing technology.

SUMMARY OF THE INVENTION

The existing differential amplification circuit is such that, in order to eliminate the heretofore described kind of current imbalance, an offset voltage correcting current source is disposed, the current source on/off is fixedly set, and the offset voltage is adjusted so as to be at a minimum before the differential amplification circuit is shipped from the factory.

However, the method of adjusting the offset voltage in this way is such that, as readjustment is difficult after once shipping, there is a problem in that it is not possible to respond when environmental conditions fluctuate, and the offset voltage changes, after shipping from the factory.

The invention, having been contrived in consideration of this point, has an object of providing an amplifying device and offset voltage correction method such that a change in offset voltage is automatically corrected, and a state wherein the offset voltage is reduced is maintained regardless of fluctuation in environmental conditions.

In order to resolve the heretofore described problem, an amplifying device is provided. The amplifying device includes a differential amplification unit, an offset voltage measurement unit, a control unit, and an offset voltage correction unit.

The differential amplification unit has differential pair transistors and amplifies a difference between input voltages. The offset voltage measurement unit samples offset voltage generated due to an imbalance in the current drive capacities of the differential pair transistors in a first mode, and determines the polarity of the sampled offset voltage in a second mode. The control unit switches the operating mode between the first mode and second mode, and outputs a control signal for correcting the offset voltage in accordance with the polarity determination result when in the second mode. The offset voltage correction unit corrects the offset voltage based on the control signal.

A state wherein offset voltage is reduced can be maintained regardless of environmental fluctuation.

DETAILED DESCRIPTION OF THE INVENTION

Hereafter, embodiments of the invention will be described with reference to the drawings. Redundant descriptions may be omitted by giving the same reference signs to components having essentially the same functions in the specification and drawings.

First Embodiment

Figure 1:
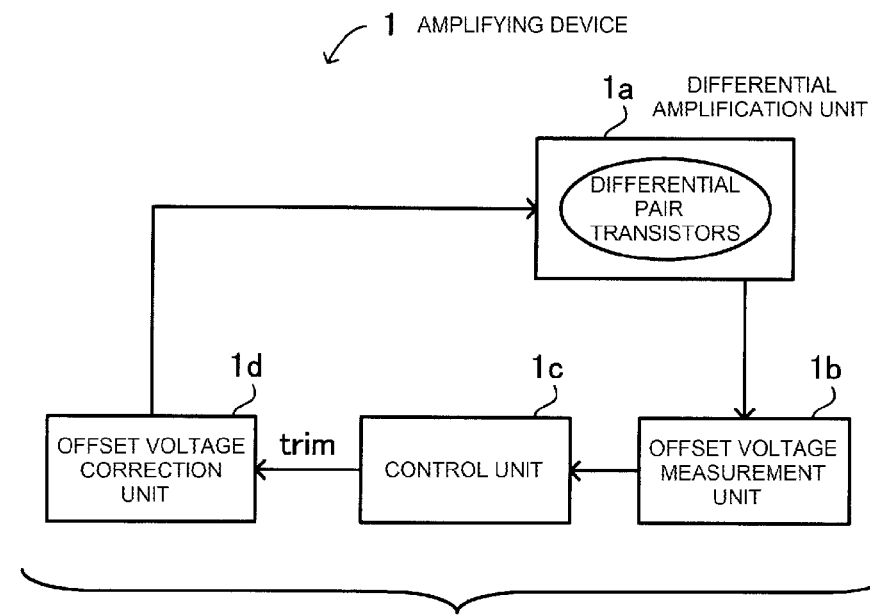
FIG. 1 is a diagram showing a configuration example of an amplifying device.
Figure 1:
Figure 1:

FIG. 1 is a diagram showing a configuration example of an amplifying device. An amplifying device 1 of a first embodiment includes a differential amplification unit 1a, an offset voltage measurement unit 1b, a control unit 1c, and an offset voltage correction unit 1d.

The differential amplification unit 1a has differential pair transistors, and amplifies a difference between input voltages. The offset voltage measurement unit 1b, in a first mode, samples an offset voltage generated due to imbalance in the current drive capabilities of the differential pair transistors. Also, in a second mode, the offset voltage measurement unit 1b determines the polarity of the sampled offset voltage.

The control unit 1c switches the operating mode between the first mode and second mode, and outputs a control signal "trim" for correcting the offset voltage in accordance with the polarity determination result when in the second mode. The offset voltage correction unit 1d corrects the offset voltage based on the control signal "trim".

Herein, it will be assumed that an offset voltage Voffset1 is sampled in the first mode. When this occurs, in this example, the offset voltage Voffset1 is determined to be a negative offset voltage in the second mode.

Thereupon, offset voltage correction in accordance with the polarity determination result is carried out in the second mode. In this case, in order to reduce the negative offset voltage Voffset1, correction such that the level of the negative offset voltage Voffset1 is raised in a positive direction is carried out.

Contrarily, it will be assumed that an offset voltage Voffset2 is sampled in the first mode. When this occurs, in this example, the offset voltage Voffset2 is determined to be a positive offset voltage in the second mode.

Thereupon, offset voltage correction in accordance with the polarity determination result is carried out in the second mode, and in this case, in order to reduce the positive offset voltage Voffset2, correction such that the level of the positive offset voltage Voffset2 is lowered in a negative direction is carried out.

In this way, the amplifying device 1 samples the offset voltage in the first mode, and determines the polarity of the sampled offset voltage in the second mode. Then, while switching between the first and second modes, the amplifying device 1 carries out offset voltage correction control in accordance with the polarity determination result.

Therefore, a state wherein offset voltage is reduced can be maintained, regardless of environmental fluctuation. Consequently, offset voltage is automatically corrected even when, for example, environmental conditions fluctuate after shipping from the factory, because of which a state wherein offset voltage is reduced is constantly maintained.

Problems to be Resolved

Next, before describing the details of the invention, a description will be given, using FIGS. 2 and 3, of problems to be resolved. Firstly, a description will be given of a configuration and operation of a general operational amplifier circuit having an offset voltage adjusting (trimming) function.

Figure 2:
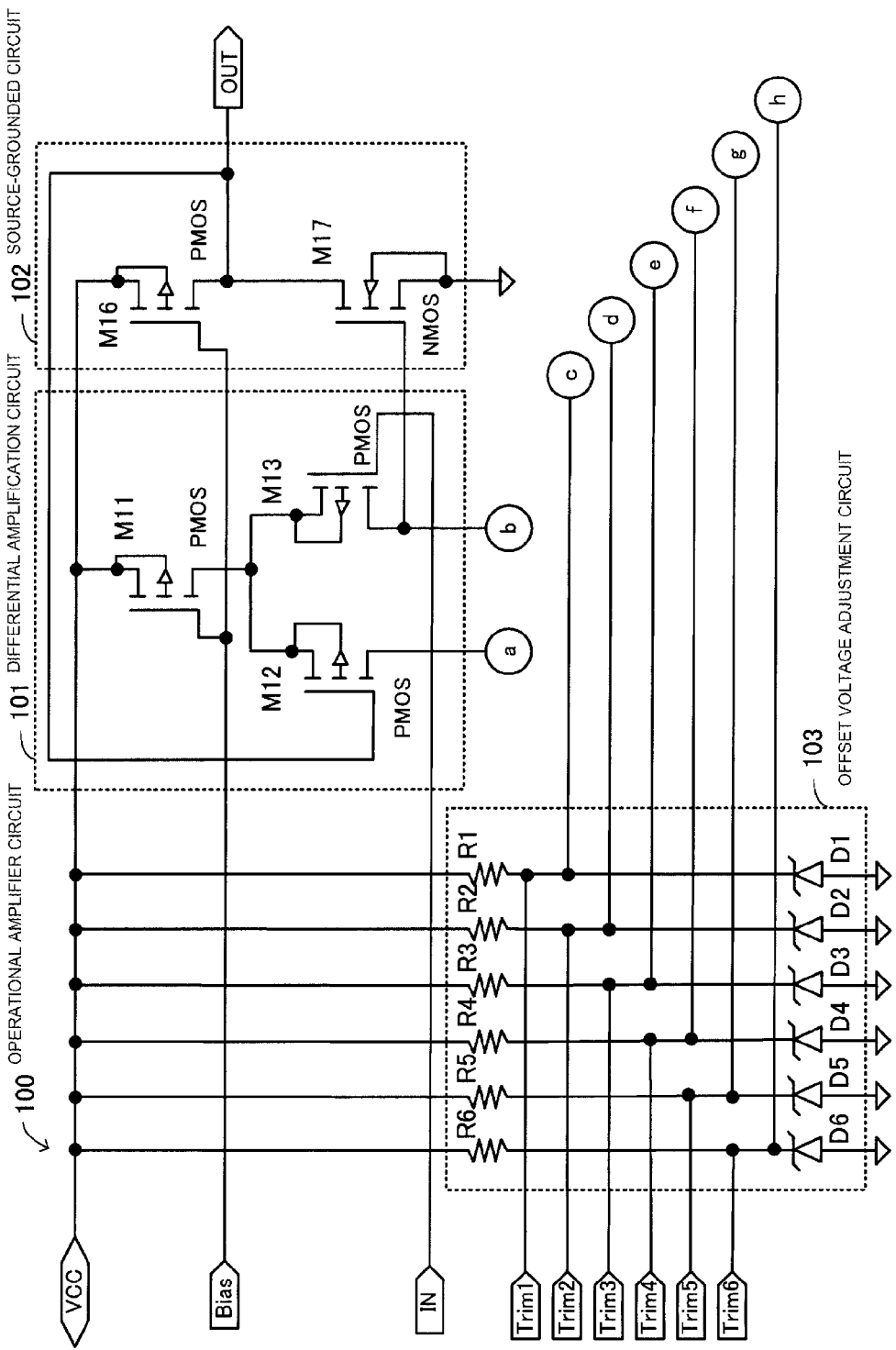
FIG. 2 is a diagram showing a configuration example of an operational amplifier circuit.
Figure 3:
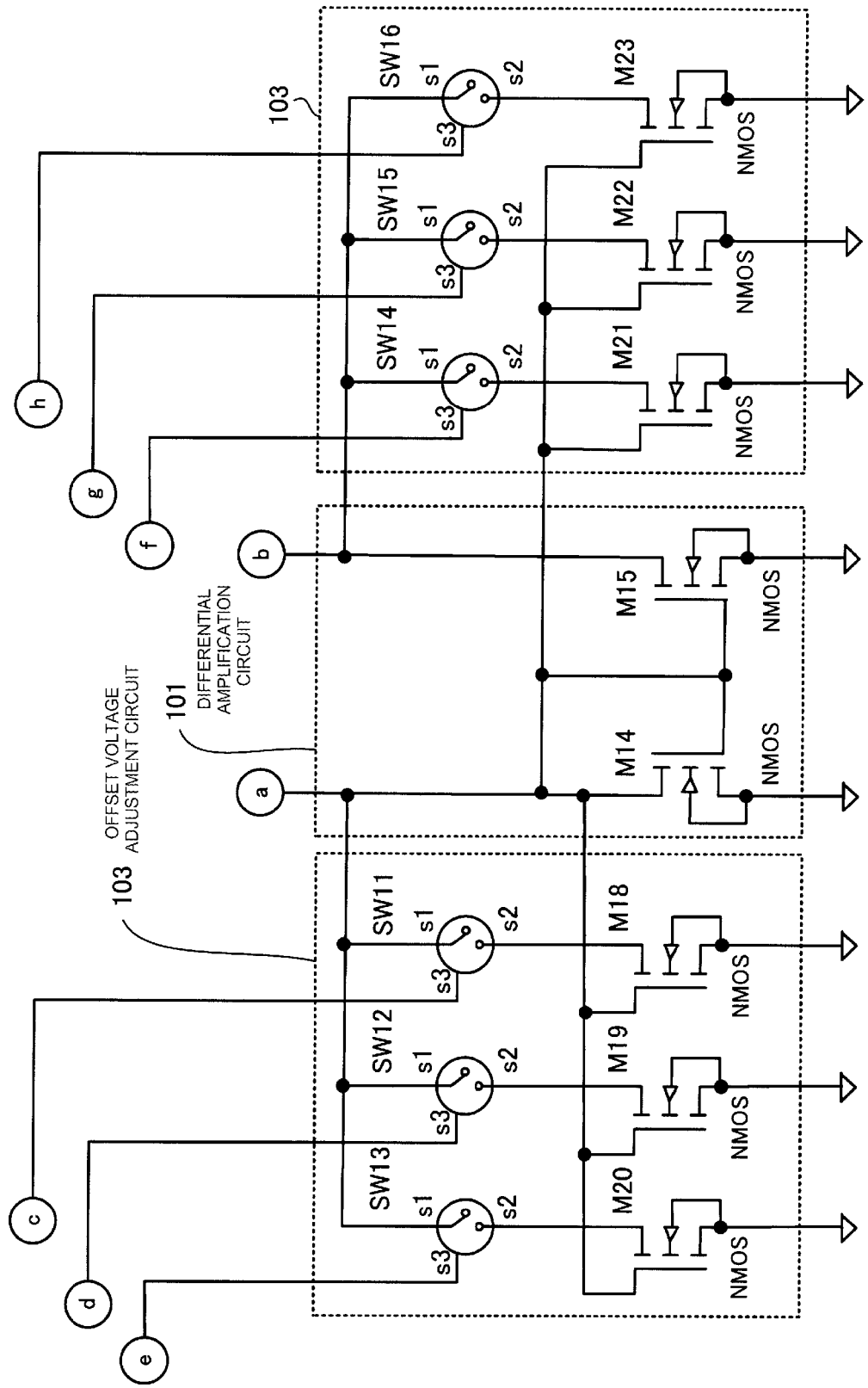
FIG. 3 is a diagram showing a configuration example of an operational amplifier circuit.

FIGS. 2 and 3 are diagrams showing a configuration example of an operational amplifier circuit. An operational amplifier circuit 100 is a two-stage (two-stage amplification) circuit including a differential amplification circuit 101, which forms an input stage, and a source-grounded circuit 102, which forms an output stage, and further includes an offset voltage adjustment circuit 103.

The operational amplifier circuit 100 is such that the gate of one transistor M12 forming differential pair transistors is connected to an output terminal OUT, and the operational amplifier circuit 100 is caused to function as a voltage follower that operates so that the input voltage of an input terminal IN and the output voltage of the output terminal OUT are equal.

The differential amplification circuit 101 includes p-channel metal-oxide-semiconductor (PMOS) transistors M11 to M13 and n-channel MOS (NMOS) transistors M14 and M15.

The source-grounded circuit 102 includes a PMOS transistor M16 and an NMOS transistor M17.

The offset voltage adjustment circuit 103 includes resistors R1 to R6, Zener diodes D1 to D6, switches SW11 to SW16, and NMOS transistors M18 to M23.

To describe the component connection relationships, a power supply terminal VCC is connected to the source of the transistor M11, the source of the transistor M16, and one end of each of the resistors R1 to R6. A bias terminal "Bias" is connected to the gate of the transistor M11 and the gate of the transistor M16.

The drain of the transistor M11 is connected to the source of the transistor M12 and the source of the transistor M13. The input terminal IN is connected to the gate of the transistor M13.

The output terminal OUT is connected to the gate of the transistor M12, the drain of the transistor M16, and the drain of the transistor M17, while the source of the transistor M17 is connected to GND.

The drain of the transistor M12 is connected to the drain of the transistor M14, the gate of the transistor M14, the gate of the transistor M15, a terminal s1 of each of the switches SW11 to SW13, and the gate of each of the transistors M18 to M23.

The drain of the transistor M13 is connected to the drain of the transistor M15 and the terminal s1 of each of the switches SW14 to SW16, while the sources of the transistors M14 and M15 are connected to GND.

An adjustment terminal Trim1 is connected to the other end of the resistor R1, the cathode of the diode D1, and a terminal s3 of the switch SW11, while an adjustment terminal Trim2 is connected to the other end of the resistor R2, the cathode of the diode D2, and the terminal s3 of the switch SW12.

An adjustment terminal Trim3 is connected to the other end of the resistor R3, the cathode of the diode D3, and the terminal s3 of the switch SW13, while an adjustment terminal Trim4 is connected to the other end of the resistor R4, the cathode of the diode D4, and the terminal s3 of the switch SW14.

An adjustment terminal Trim5 is connected to the other end of the resistor R5, the cathode of the diode D5, and the terminal s3 of the switch SW15, while an adjustment terminal Trim6 is connected to the other end of the resistor R6, the cathode of the diode D6, and the terminal s3 of the switch SW16. Also, the anodes of the diodes D1 to D6 are connected to GND.

A terminal s2 of the switch SW11 is connected to the drain of the transistor M18, the terminal s2 of the switch SW12 is connected to the drain of the transistor M19, and the terminal s2 of the switch SW13 is connected to the drain of the transistor M20.

The terminal s2 of the switch SW14 is connected to the drain of the transistor M21, the terminal s2 of the switch SW15 is connected to the drain of the transistor M22, and the terminal s2 of the switch SW16 is connected to the drain of the transistor M23. Also, the sources of the transistors M18 to M23 are connected to GND.

Herein, a concise description will be given of an offset voltage generation process. When there is a mismatch in characteristics between the left and right transistors M12 and M13 forming the differential pair, imbalance occurs between a current $I_{M12}$ flowing through the transistor M12 and a current $I_{M13}$ flowing through the transistor M13.

Meanwhile, as the transistors M14 and M15, which are active loads, have a common gate-to-source voltage Vgs, the same current attempts to flow through the transistors M14 and M15.

Therefore, the voltage output from the output terminal OUT varies, feedback from the output voltage is applied to the differential pair transistors M12 and M13, and a difference occurs in the voltages applied to the differential pair transistors M12 and M13 so as to eliminate the imbalance between the current $I_{M12}$ and current $I_{M13}$.

Then, on the imbalance between the current $I_{M12}$ and current $I_{M13}$ being eliminated, the circuit system stabilizes. The difference between the voltages applied to the differential pair transistors M12 and M13 at this time is the offset voltage.

In the same way, when there is a mismatch in characteristics between the active load transistors M14 and M15, imbalance occurs in the currents flowing through the transistors M14 and M15, and offset voltage is generated.

Offset voltage is generated through this kind of process, but the operational amplifier circuit 100 shown in FIGS. 2 and 3 is such that the offset voltage adjustment circuit 103 is included in order to correct current imbalance, which is a factor in offset voltage generation, from the exterior.

The offset voltage adjustment circuit 103 has a configuration wherein a multiple of current sources are disposed in parallel to the active load transistors M14 and M15 connected to the GND side of the differential pair transistors M12 and M13.

In this example, with three current sources being disposed on each of the left and right sides, specifically, the six transistors M18 to M23 are used as the current sources. Also, the offset voltage adjustment circuit 103 is of a configuration wherein the transistors M18 to M23 are switched on and off by the switches SW11 to SW16.

The switches SW11 to SW16 are such that the terminal s3 is a switch switching control terminal, and the switches SW11 to SW16 are turned on and off in accordance with the level applied to the terminal s3.

Also, the switching between the turning on and off of the switches SW11 to SW16 is set when shipping from the factory by Zener-zap trimming.

Zener-zap trimming is a one-time only adjustment method whereby level and resistance value are fixedly set (stored) by a high voltage being applied to both ends of a predetermined Zener diode on a wafer, and the Zener diode being destroyed (zapped) to cause a short circuit. Other than a Zener diode, a polysilicon fuse, or the like, may be used.

The operational amplifier circuit 100 has a trimming circuit including the Zener diodes D1 to D6 and the resistors R1 to R6 as a circuit portion in which Zener-zap trimming is carried out.

Herein, it is assumed that the switches SW11 to SW16 are such that when an H level is applied to the terminal s3, the switch is turned on, while when an L level is applied, the switch is turned off.

As the H level is applied to the terminals s3 of the switches SW11 to SW16 with the configuration as it is, the switches SW11 to SW16 are all in an on-state.

When, for example, the switches SW11 to SW13 are to be turned off from this state, the L level is applied to the terminals s3 of the switches SW11 to SW13, and the switches SW11 to SW13 are turned off, by zapping the diodes D1 to D3, causing one end of each of the resistors R1 to R3 to be short-circuited with GND.

As heretofore described, the operational amplifier circuit 100 is such that the turning on and off of the transistors M18 to M23, which are current sources, is controlled by the switches SW11 to SW16, while monitoring the output voltage of the output terminal OUT, so that the offset voltage is at a minimum when shipping from the factory.

Further, the combination of on and off states of the switches SW11 to SW16 is stored in the trimming circuit when shipping from the factory, and the product is shipped in a state wherein the offset voltage is set to a minimum.

However, as the on/off setting of the switches SW11 to SW16 carried out when shipping from the factory is carried out fixedly, there is a problem in that when the differential pair transistor or active load characteristics deviate, and the offset voltage varies, in accompaniment to subsequent environmental fluctuation (temperature fluctuation, power supply voltage fluctuation, or the like), it is not possible to respond to the variation in offset voltage.

The invention, having been contrived in consideration of this point, provides an amplifying device and offset voltage adjustment method such that a change in offset voltage is automatically corrected, and a state wherein the offset voltage is reduced is accurately maintained.

Second Embodiment

Figure 4:
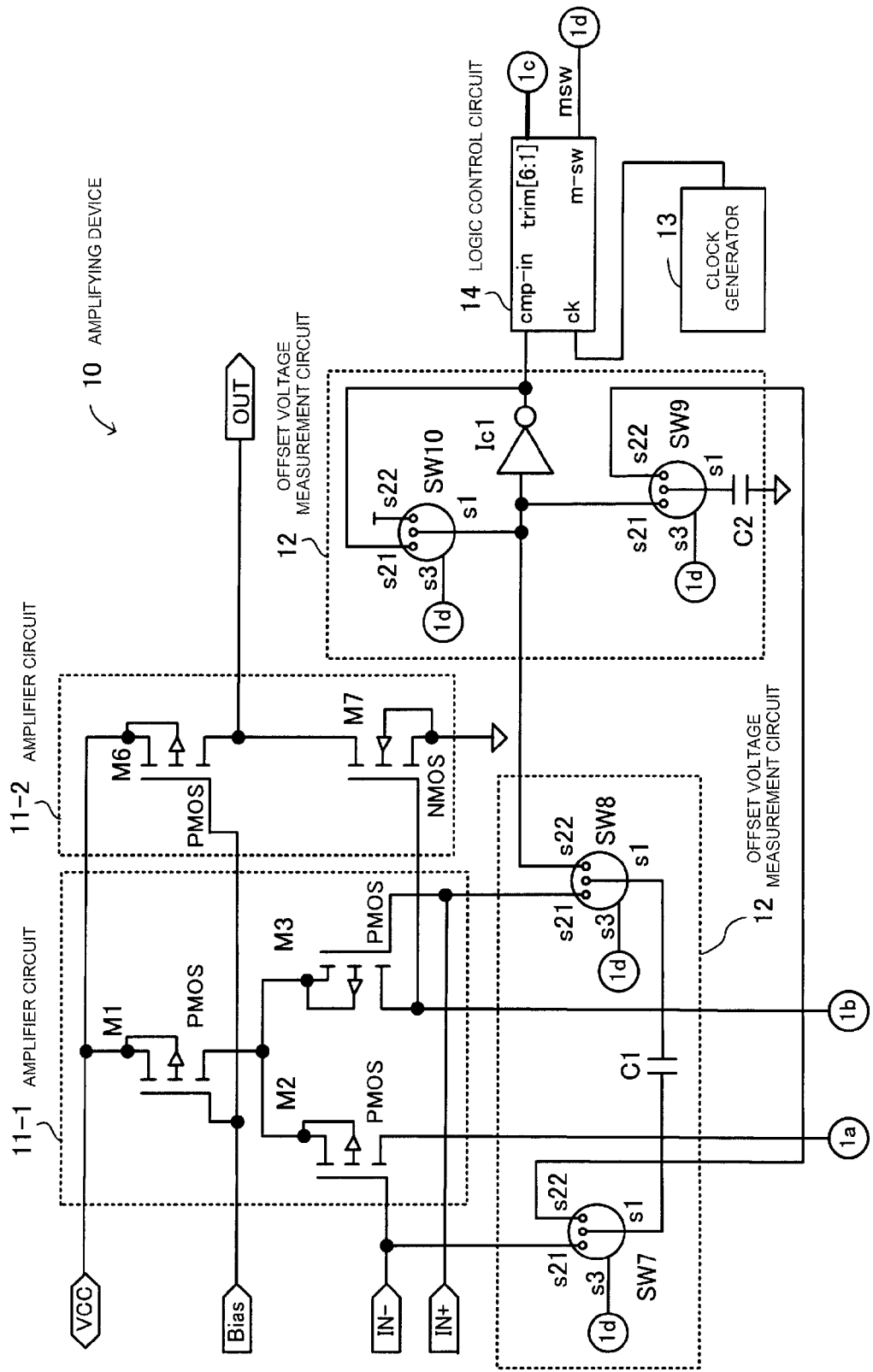
FIG. 4 is a diagram showing a configuration example of an amplifying device.
Figure 5:
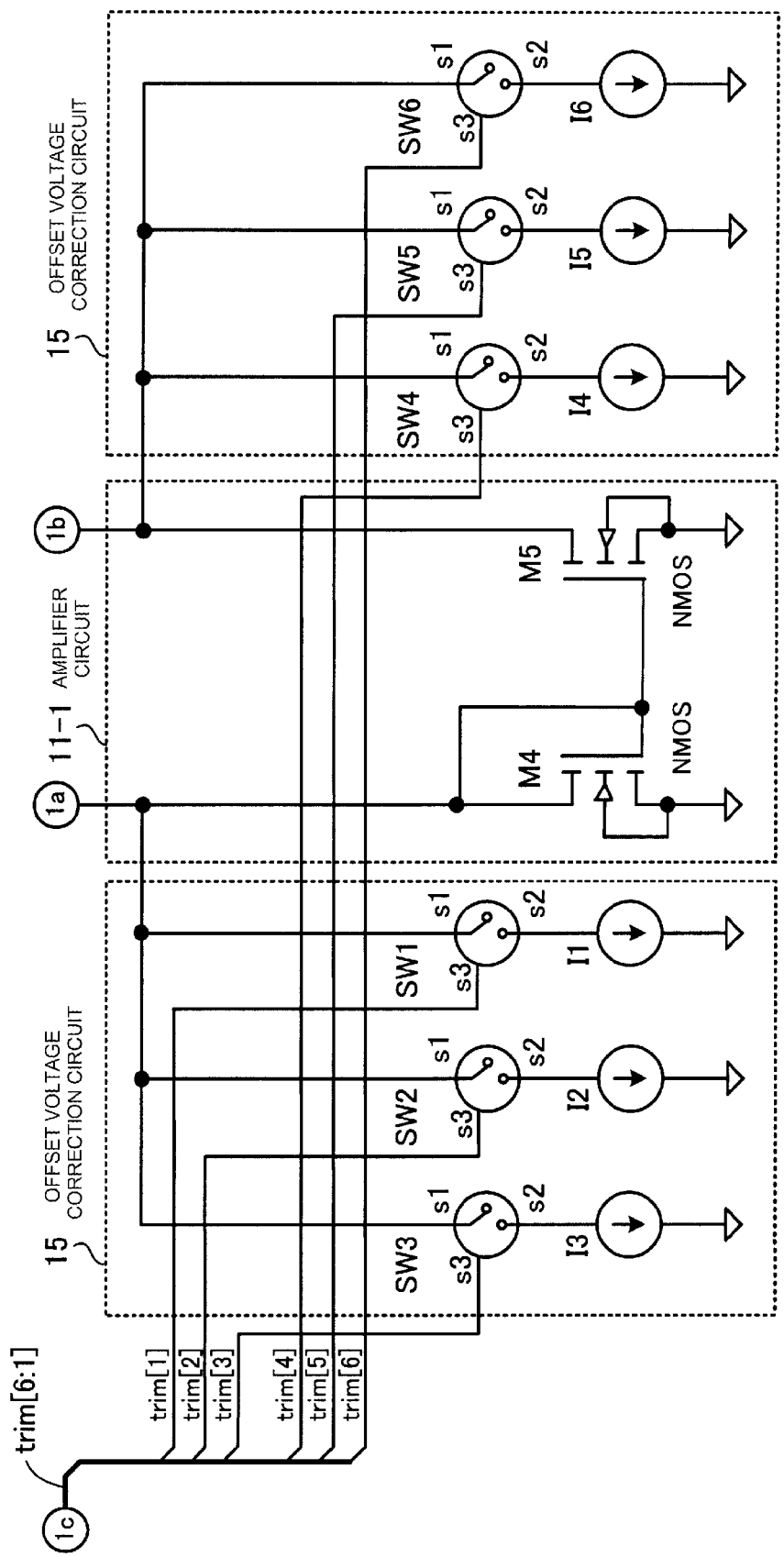
FIG. 5 is a diagram showing a configuration example of an amplifying device.

Next, an amplifying device of the invention will be described in detail. FIGS. 4 and 5 are diagrams showing a configuration example of an amplifying device.

An amplifying device 10 of a second embodiment includes amplifier circuits 11-1 and 11-2, an offset voltage measurement circuit 12, a clock generator 13, a logic control circuit 14, and an offset voltage correction circuit 15.

The correspondence to the components of FIG. 1 is such that the differential amplification unit 1a corresponds to the function of the amplifier circuit 11-1, and the offset voltage measurement unit 1b corresponds to the function of the offset voltage measurement circuit 12. Also, the control unit 1c corresponds to the functions of the clock generator 13 and logic control circuit 14, and the offset voltage correction unit 1d corresponds to the function of the offset voltage correction circuit 15.

The amplifier circuit 11-1 includes a current source PMOS transistor M1, differential pair PMOS transistors M2 and M3, and NMOS transistors M4 and M5, which are active loads, and amplifies the voltage differential of two input signals input from input terminals IN+ and IN−.

The amplifier circuit 11-2 includes a PMOS transistor M6 and an NMOS transistor M7, and amplifies the output voltage of the amplifier circuit 11-1.

The offset voltage measurement circuit 12 includes an offset voltage sampling capacitor C1 (first sampling unit), a threshold voltage sampling capacitor C2 (second sampling unit), an inverter Ic1 (logic element), and mode switching switches SW7 to SW10.

The offset voltage sampling capacitor C1 (hereafter, the capacitor C1) samples offset voltage that is a voltage differential occurring between the gate of the differential pair transistor M2 and the gate of the differential pair transistor M3.

The threshold voltage sampling capacitor C2 (hereafter, the capacitor C2) samples a threshold voltage Vth0 of the inverter Ic1. The inverter Ic1 determines whether the polarity of the offset voltage is positive or negative.

The mode switching switches SW7 to SW10 switch the whole circuit between two operating modes, to be described hereafter, based on a mode switching signal msw transmitted from the logic control circuit 14.

The clock generator 13 causes oscillation of a clock for driving the logic control circuit 14. The logic control circuit 14, based on the clock supplied from the clock generator 13, outputs the mode switching signal msw for switching the operating mode at constant intervals.

Furthermore, the logic control circuit 14, based on the result of the offset voltage polarity determination, outputs an adjustment data bus "trim" (6:1) for correcting the offset voltage so that the offset voltage is of a predetermined value, thus controlling the offset voltage correction circuit 15.

The offset voltage correction circuit 15 includes current sources I1 to I6 and drive switches SW1 to SW6, and gradually corrects the offset voltage in constant voltage steps based on the data of the adjustment data bus "trim" (6:1) from the logic control circuit 14. Also, the current sources I1 to I6 have a current drive capacity corresponding to the weighting of the offset voltage correction amount (to be illustrated hereafter in FIG. 13).

NMOS transistors, for example, can be used for the current sources I1 to I6, as for the transistors M18 to M23 shown in FIG. 3, but in the following description, the current sources I1 to I6 are shown concisely using the reference signs representing the current sources.

Next, the component connection relationships of the amplifying device 10 will be described. The power supply terminal VCC is connected to the source of the transistor M1 and the source of the transistor M6. The bias terminal "Bias" is connected to the gate of the transistor M1 and the gate of the transistor M6.

The input terminal IN+ is connected to the gate of the transistor M3 and a terminal s21 of the switch SW8, while the input terminal IN− is connected to the gate of the transistor M2 and the terminal s21 of the switch SW7.

The output terminal OUT is connected to the drain of the transistor M6 and the drain of the transistor M7. The source of the transistor M7 is connected to GND.

The drain of the transistor M1 is connected to the source of the transistor M2 and the source of the transistor M3. The drain of the transistor M2 is connected to the terminal s1 of each of the switches SW1 to SW3, the drain of the transistor M4, the gate of the transistor M4, and the gate of the transistor M5.

The drain of the transistor M3 is connected to the gate of the transistor M7, the terminal s1 of each of the switches SW4 to SW6, and the drain of the transistor M5. The sources of the transistors M4 and M5 are connected to GND.

The output terminal of the clock generator 13 is connected to a clock input terminal ck of the logic control circuit 14. An input terminal cmp-in of the logic control circuit 14 (the terminal into which the result of polarity determination is input) is connected to the output terminal of the inverter Ic1 and the terminal s21 of the switch SW10. A terminal s22 of the switch SW10 is open.

An output terminal m-sw of the logic control circuit 14 is connected to the terminal s3 of each of the switches SW7 to SW10. The terminal s1 of the switch SW8 is connected to one end of the capacitor C1, while the terminal s1 of the switch SW7 is connected to the other end of the capacitor C1.

The terminal s22 of the switch SW7 is connected to the terminal s22 of the switch SW9, while the terminal s22 of the switch SW8 is connected to the terminal s1 of the switch SW10, the input terminal of the inverter Ic1, and the terminal s21 of the switch SW9. The terminal s1 of the switch SW9 is connected to one end of the capacitor C2, while the other end of the capacitor C2 is connected to GND.

An output terminal trim(6:1) of the logic control circuit 14 is a 6-bit bus wire including adjustment data bits trim(1) to trim(6).

The adjustment data bit trim(1) is connected to the terminal s3 of the switch SW1, the adjustment data bit trim(2) is connected to the terminal s3 of the switch SW2, and the adjustment data bit trim(3) is connected to the terminal s3 of the switch SW3.

The adjustment data bit trim(4) is connected to the terminal s3 of the switch SW4, the adjustment data bit trim(5) is connected to the terminal s3 of the switch SW5, and the adjustment data bit trim(6) is connected to the terminal s3 of the switch SW6.

The terminal s2 of the switch SW1 is connected to the input terminal of the current source I1, the terminal s2 of the switch SW2 is connected to the input terminal of the current source I2, and the terminal s2 of the switch SW3 is connected to the input terminal of the current source I3.

The terminal s2 of the switch SW4 is connected to the input terminal of the current source I4, the terminal s2 of the switch SW5 is connected to the input terminal of the current source I5, and the terminal s2 of the switch SW6 is connected to the input terminal of the current source I6. The output terminals of the current sources I1 to I6 are connected to GND.

Figure 6:
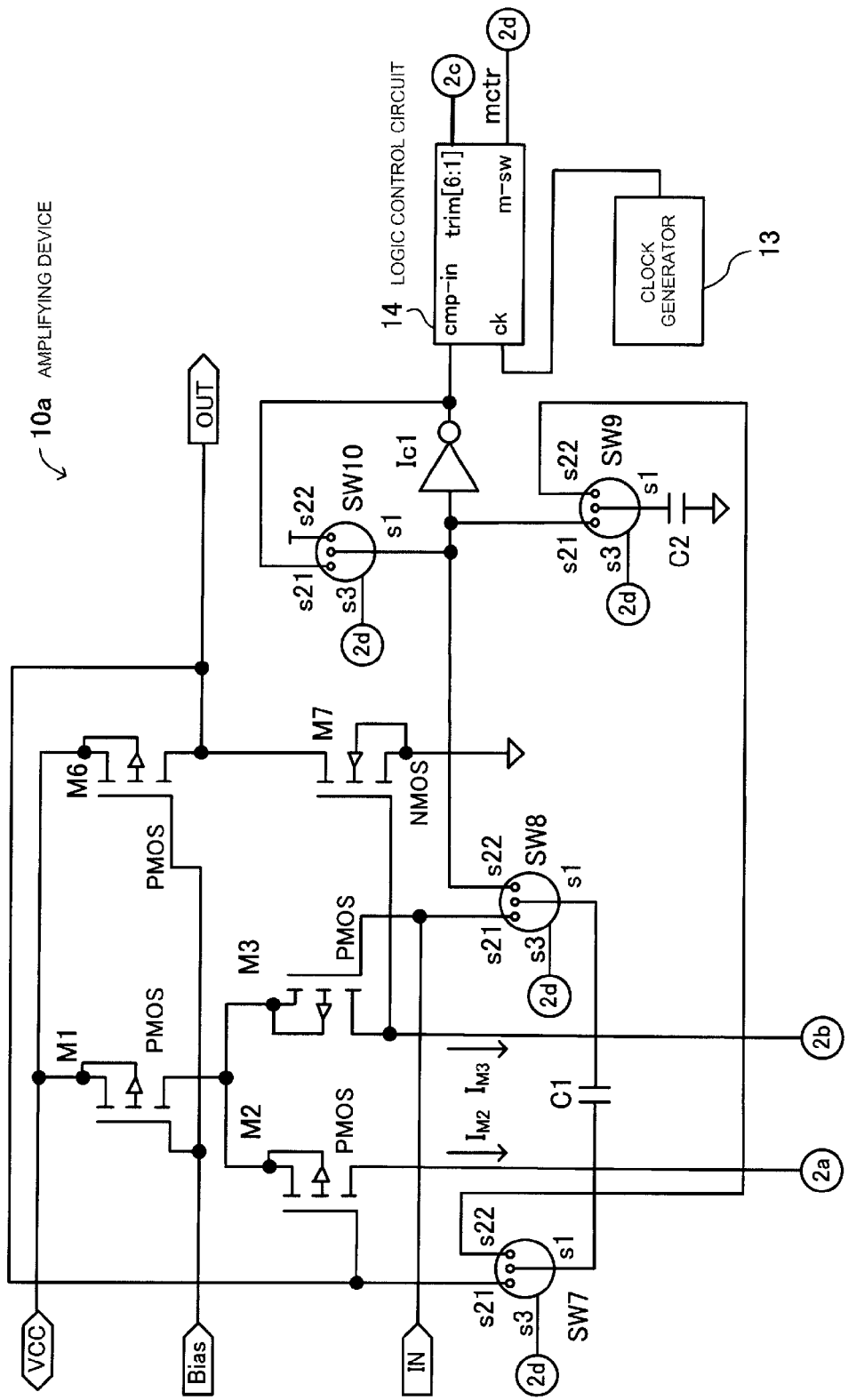
FIG. 6 is a diagram showing a configuration example of an amplifying device.
Figure 7:
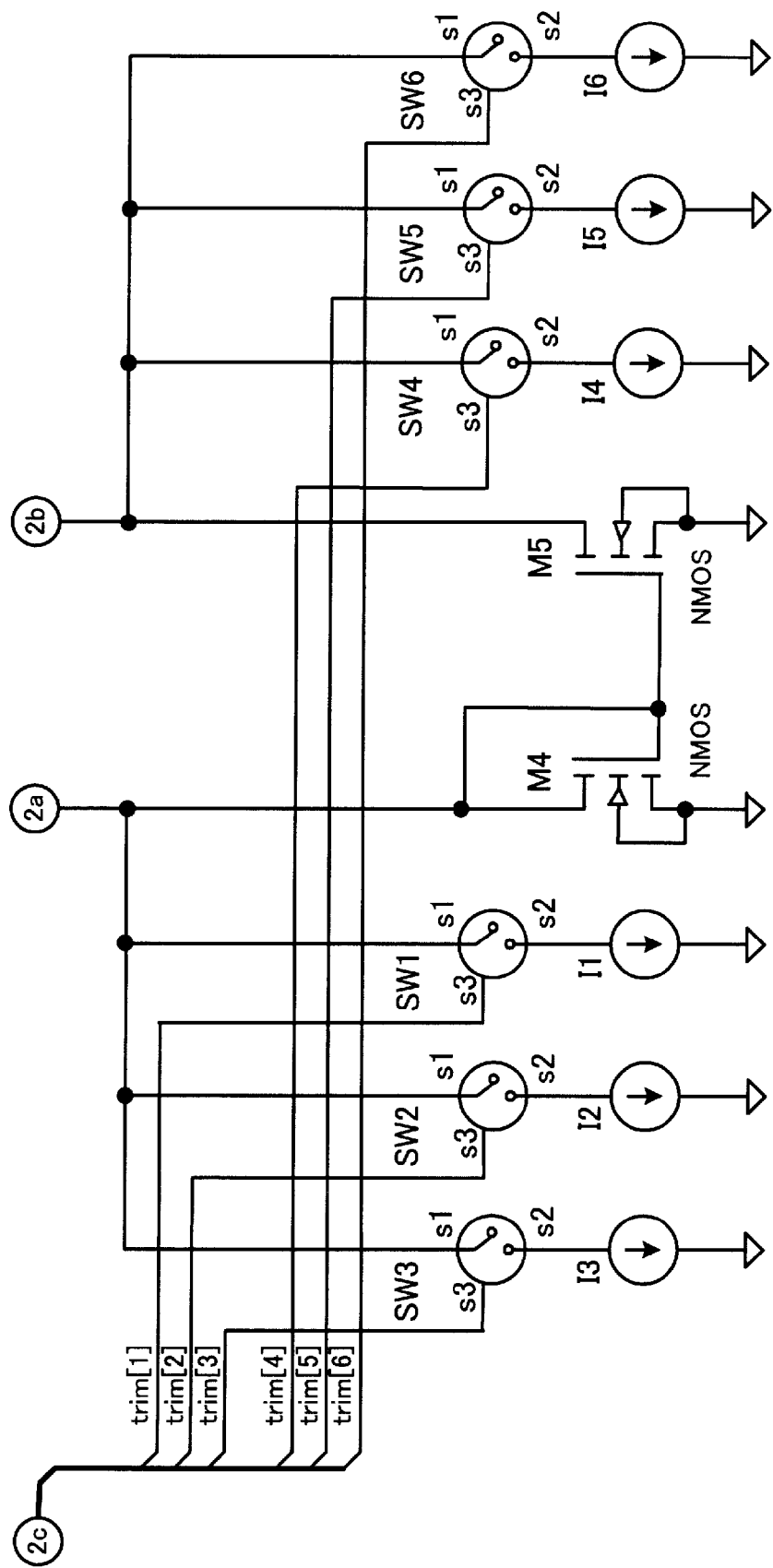
FIG. 7 is a diagram showing a configuration example of an amplifying device.

FIGS. 6 and 7 are diagrams showing a configuration example of an amplifying device. FIGS. 6 and 7 show a configuration example of a case wherein the amplifying device 10 shown in FIGS. 4 and 5 is caused to function as a voltage follower.

Places in an amplifying device 10a differing from the configuration of the amplifying device 10 are that there is no input terminal IN−, and that the gate of the transistor M2 is connected to the output terminal OUT, the drain of the transistor M6, the drain of the transistor M7, and the terminal s21 of the switch SW7. Other configurations are the same as in FIGS. 4 and 5.

Next, a description will be given of an outline of a case wherein the offset voltage correction control of the invention is applied to the amplifying device 10a functioning as a voltage follower (hereafter, a description will be given using the amplifying device 10a, but the same offset voltage correction control is also applied in the case of the amplifying device 10).

It will be assumed that the offset voltage of the amplifying device 10a is negative due to a difference between the characteristics of the differential pair transistors M2 and M3. A negative offset voltage is an offset voltage that reduces an output voltage Vout of the output terminal OUT so as to be lower than an input voltage Vin of the input terminal IN.

In this case, a gate-to-source voltage $|Vgs_{(M2)}|$ of the transistor M2 is greater than a gate-to-source voltage $|Vgs_{(M3)}|$ of the transistor M3 ($|Vgs_{(M2)}|>|Vgs_{(M3)}|$), and a current $I_{M2}$ flowing through the transistor M2 and current $I_{M3}$ flowing through the transistor M3 are equal ($I_{M2}=I_{M3}$).

Herein, consideration will be given to a state wherein the offset voltage is cancelled, that is, when the Vgs of the transistors M2 and M3 are equal. In this case, $I_{M2}<I_{M3}$. When assuming that the drive capacities of the transistors M4 and M5 are equal in this state, the current flowing through M2 and current flowing through M4 are equal, and the current flowing through M4 and current flowing through M5 are equal.

Therefore, a current $I_{M4}$ flowing out of the drain of M5 is smaller than the current $I_{M3}$ flowing in, and imbalance occurs. It is known that, in order to cancel the offset voltage, it is sufficient to eliminate this imbalance.

Consequently, when a negative offset voltage is generated, the switches SW4, SW5, and SW6 are turned on one by one, and the current sources 14, 15, and 16 are added one by one as active loads, thereby increasing the current drive capacity of the active load connected on the GND side of the differential pair transistor M3.

By so doing, the gate voltage of the transistor M7 drops, the OUT terminal voltage rises, and the gate-to-source voltage $|Vgs_{(M2)}|$ of the transistor M2 decreases. Therefore, the difference between the gate-to-source voltage $|Vgs_{(M2)}|$ of the transistor M2 and the gate-to-source voltage $|Vgs_{(M3)}|$ of the transistor M3 decreases.

By carrying out this kind of control to increase the drive capacity of the active load connected to the drain of the transistor M3, the negative offset voltage is reduced.

Contrarily, it will be assumed that the offset voltage of the amplifying device 10a is positive due to a difference between the characteristics of the differential pair transistors M2 and M3. A positive offset voltage is an offset voltage that increases the output voltage Vout of the output terminal OUT so as to be greater than the input voltage Vin of the input terminal IN.

In this case, the gate-to-source voltage $|Vgs_{(M3)}|$ of the transistor M3 is greater than the gate-to-source voltage $|Vgs_{(M2)}|$ of the transistor M2 ($|Vgs_{(M3)}|>|Vgs_{(M2)}|$), and the current $I_{M3}$ flowing through the transistor M3 and current $I_{M2}$ flowing through the transistor M2 are equal ($I_{M3}=I_{M2}$).

Herein, consideration will be given to a state wherein the offset voltage is cancelled, that is, when the Vgs of the transistors M2 and M3 are equal. In this case, $I_{M2}>I_{M3}$. When assuming that the drive capacities of the transistors M4 and M5 are equal in this state, the current flowing through M2 and current flowing through M4 are equal, and the current flowing through M4 and current flowing through M5 are equal.

Therefore, the current $I_{M4}$ flowing out of the drain of M5 is greater than the current $I_{M3}$ flowing in, and imbalance occurs. It is known that, in order to cancel the offset voltage, it is sufficient to eliminate this imbalance.

Consequently, when a positive offset voltage is generated, the switches SW1, SW2, and SW3 are turned on one by one, and the current sources I1, I2, and I3 are added one by one as active loads, thereby increasing the current drive capacity of the active load connected on the GND side of the differential pair transistor M2.

By so doing, the gate voltages of the transistors M4 and M5 drop, the current flowing out of M5 decreases, the gate voltage of the transistor M7 rises, the OUT terminal voltage drops, and the gate-to-source voltage $|Vgs_{(M2)}|$ of the transistor M2 increases.

Therefore, the difference between the gate-to-source voltage $|Vgs_{(M2)}|$ of the transistor M2 and the gate-to-source voltage $|Vgs_{(M3)}|$ of the transistor M3 decreases.

By carrying out this kind of control to increase the drive capacity of the active load connected to the drain of the transistor M2, the positive offset voltage is reduced.

The amplifying device 10a is such that a state wherein the absolute value of the offset voltage is constantly reduced is maintained by implementing the heretofore described kind of operation. Also, the amplifying device 10a has two operating modes in order to autonomously control this kind of operation.

Specifically, the amplifying device 10a has a sampling mode (first mode) and a correction mode (second mode). The sampling mode is an operating mode wherein an offset voltage generated due to a difference between the differential pair transistor characteristics is sampled, and the threshold voltage of an element that carries out offset voltage polarity determination is sampled.

The correction mode is an operating mode wherein the polarity of the offset voltage is determined based on the sampling result, and correction to a state wherein the absolute value of the offset voltage is reduced is carried out.

Next, the sampling mode and correction mode will be described. The logic control circuit 14 toggles the H level and L level of the mode switching signal msw in accordance with a clock supplied from the clock generator 13.

Specifically, it is assumed that the H level of the supplied clock is the H level of the mode switching signal msw, while the L level of the supplied clock is the L level of the mode switching signal msw.

Further, switching control of the turning on and off of the mode switching switches SW7 to SW10 is carried out based on the level of the mode switching signal msw, thereby switching between the sampling mode and correction mode at constant intervals.

As the terminal s3 is the switch switching control terminal, the terminal s1 of each of the switches SW7 to SW10 drives in accordance with the level of applied to the terminal s3, and the terminal s1 is connected to the terminal s21 or connected to the terminal s22.

Figure 8:
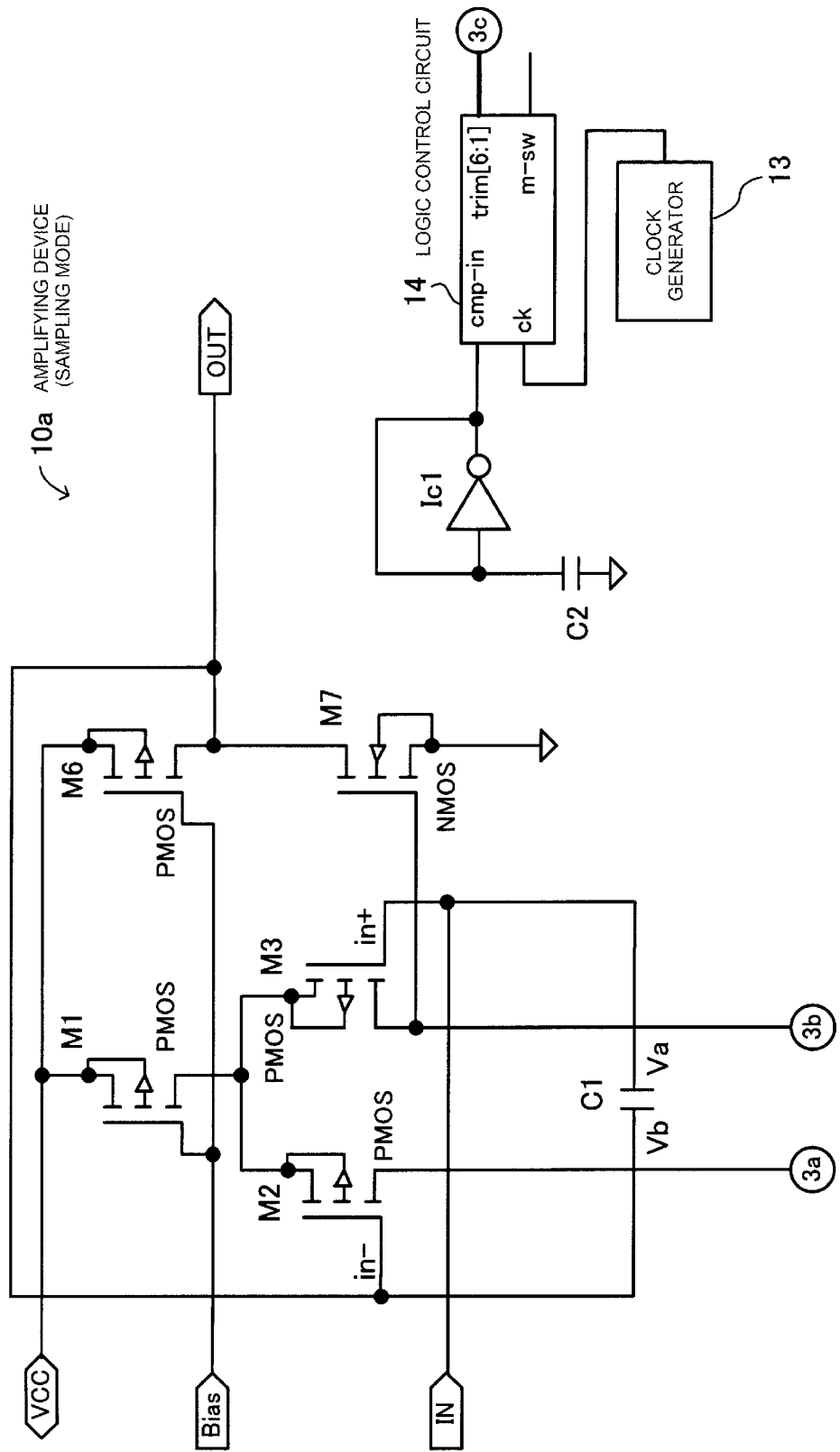
FIG. 8 is a diagram showing a configuration example of an amplifying device in a sampling mode.
Figure 9:
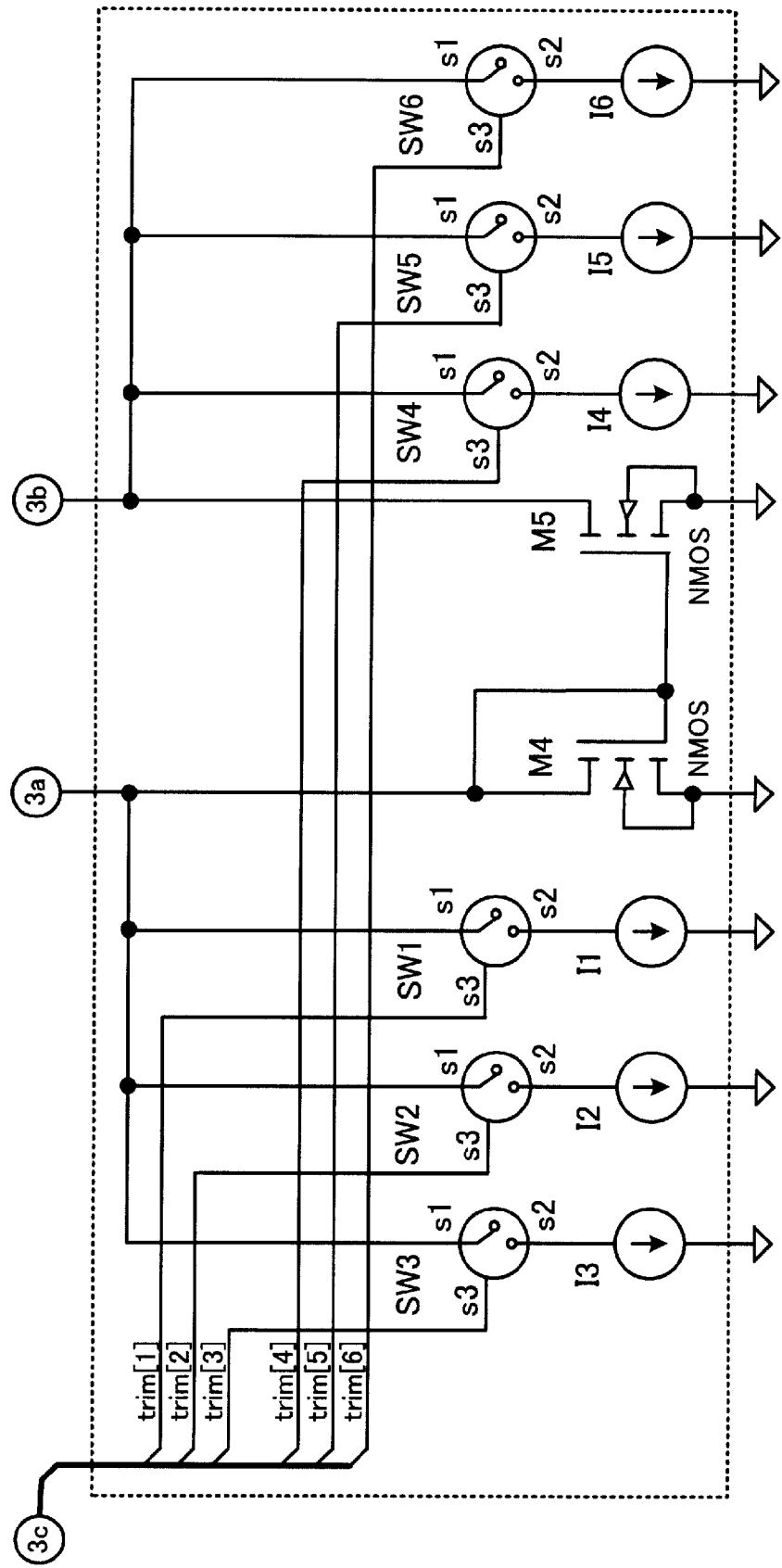
FIG. 9 is a diagram showing a configuration example of an amplifying device in a sampling mode.

FIGS. 8 and 9 are diagrams showing a configuration example of the amplifying device in the sampling mode. When the mode switching signal msw is at the H level, the terminal s1 of each of the switches SW7 to SW10 is conductive with the terminal s21, at which time the amplifying device 10a is in the sampling mode.

The circuit configuration of the amplifying device 10a when in the sampling mode is such that one end of the capacitor C1 (first capacitor) is connected to the gate of the transistor M3 (first transistor), while the other end of the capacitor C1 is connected to the gate of the transistor M2 (second transistor).

Also, the input terminal of the inverter Ic1 is connected to one end of the capacitor C2 (second capacitor) and the input terminal of the logic control circuit 14 (the switches SW7 to SW10 are omitted from the drawings). Other configurations are the same as in FIGS. 6 and 7.

An operation will be described. Firstly, it will be assumed that a threshold voltage $Vth_{M2}$ of the transistor M2 is a(mV) smaller than a threshold voltage $Vth_{M3}$ of the transistor M3 due to a difference between the characteristics of the differential pair transistors M2 and M3 (a is a positive number).

In this case, more current flows through the transistor M3 than through the transistor M2, because of which feedback is applied, and the IN− potential is lower than the IN+ potential.

Therefore, as a voltage follower, the potential of the output voltage Vout is lower by a(mV) than the input voltage Vin, and a negative offset voltage (−a(mV)) is generated. Also, the capacitor C1 is charged by the charge of the offset voltage, with a potential Vb as a reference.

Conversely, it will be assumed that the threshold voltage $Vth_{M3}$ of the transistor M3 is a (mV) smaller than the threshold voltage $Vth_{M2}$ of the transistor M2 due to a difference between the characteristics of the transistors M2 and M3 (a is a positive number).

In this case, more current flows through the transistor M2 than through the transistor M3, because of which feedback is applied, and the IN+ potential is lower than the IN− potential.

Therefore, as a voltage follower, the potential of the output voltage Vout is higher by a (mV) than the input voltage Vin, and a positive offset voltage (+a(mV)) is generated. Also, the capacitor C1 is charged by the charge of the offset voltage, with a potential Va as a reference.

Meanwhile, to focus on a portion peripheral to the capacitor C2, the input/output of the inverter Ic1 is short-circuited in the sampling mode. Consequently, the output voltage of the inverter Ic1 is the threshold voltage Vth0 of the inverter Ic1 itself, and the capacitor C2 is charged by the threshold voltage Vth0.

Figure 10:
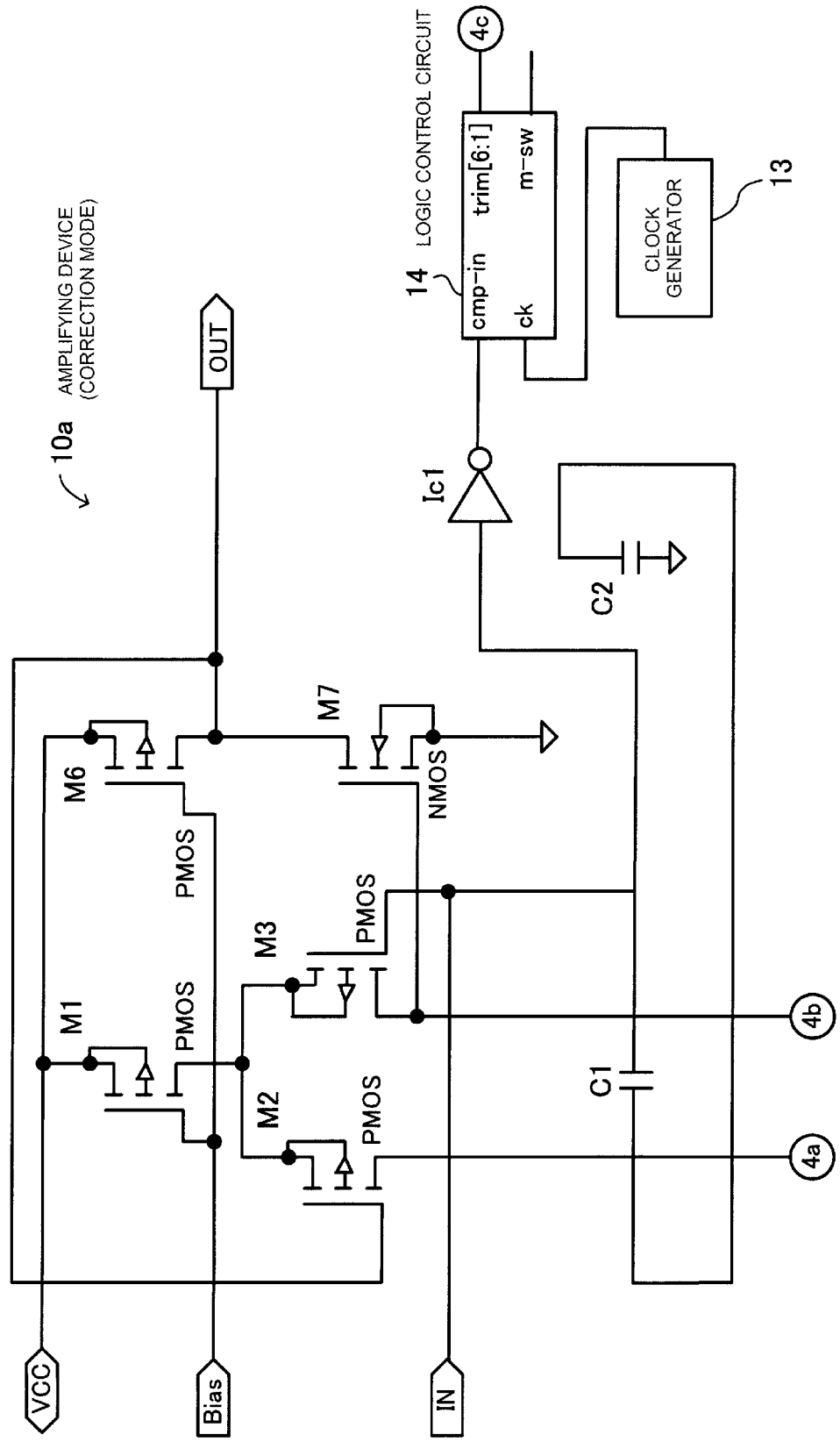
FIG. 10 is a diagram showing a configuration example of an amplifying device in a correction mode.
Figure 11:
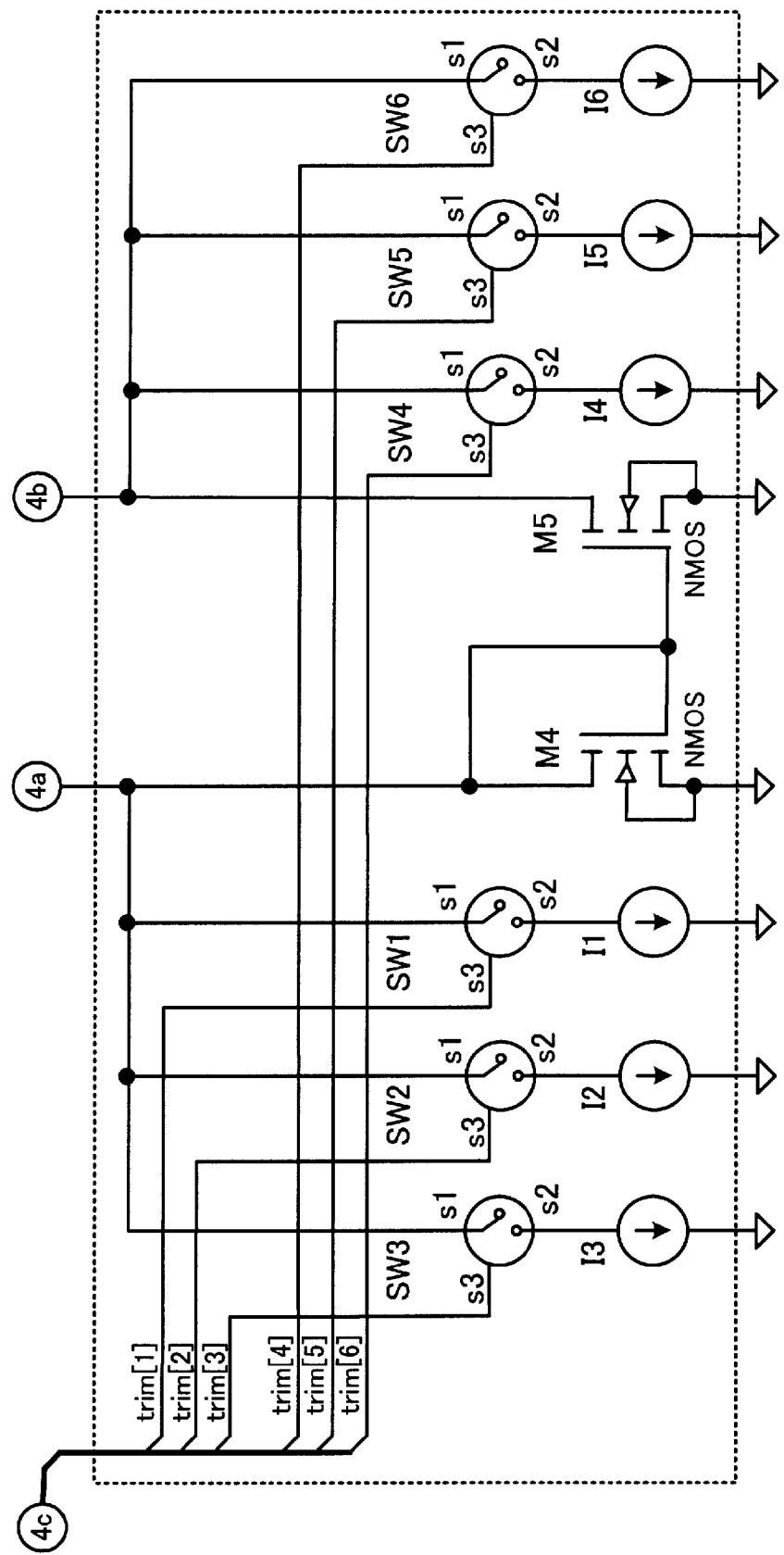
FIG. 11 is a diagram showing a configuration example of an amplifying device in a correction mode.

FIGS. 10 and 11 are diagrams showing a configuration example of the amplifying device in the correction mode. When the mode switching signal msw is at the L level, the terminal s1 of each of the switches SW7 to SW10 is conductive with the terminal s22, at which time the amplifying device 10a is in the correction mode.

The circuit configuration of the amplifying device 10a when in the correction mode is such that one end of the capacitor C1 (first capacitor) is connected to the input terminal of the inverter Ic1, the other end of the capacitor C1 is connected to one end of the capacitor C2 (second capacitor), and the capacitors C1 and C2 are connected in series (the switches SW7 to SW10 are omitted from the drawings). Other configurations are the same as in FIGS. 6 and 7.

Figures 12, 13:
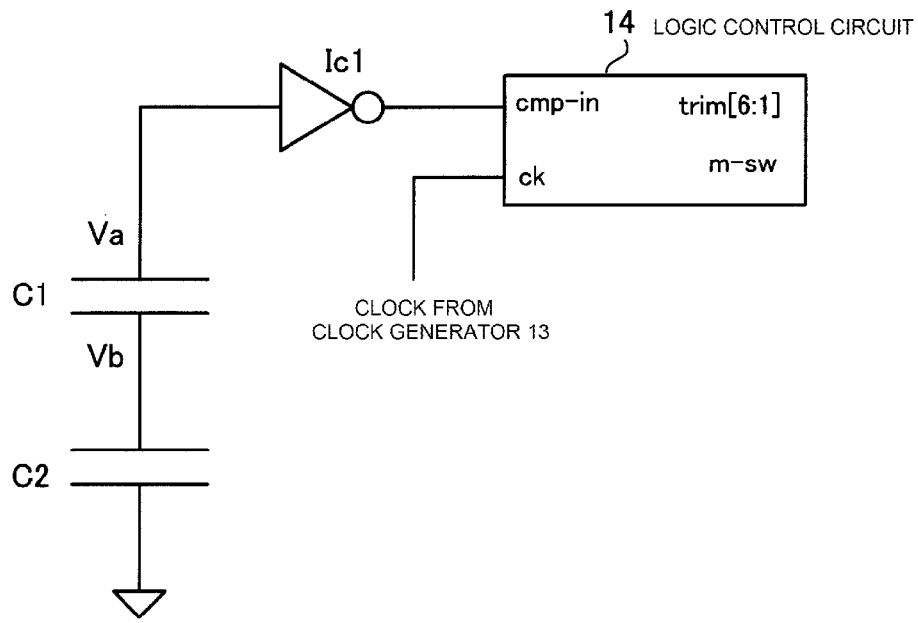
FIG. 12 is a diagram showing the configuration of an input peripheral portion of a logic control circuit in a correction mode.
FIG. 13 is a diagram showing an example of offset voltage correction amount weighting.

For ease of understanding, the configuration of an input peripheral portion of the logic control circuit 14 (the connection configuration of the capacitors C1 and C2 and the inverter Ic1) in the correction mode is shown in FIG. 12.

An operation will be described. When a negative offset voltage (−a(mV)) is sampled when in the sampling mode, the capacitor C1 is charged by the offset voltage (a(mV)), with the potential Vb as a reference, while the capacitor C2 is charged by the threshold voltage Vth0 of the inverter Ic1.

Consequently, when the capacitors C1 and C2 are connected in series in a state wherein a negative offset voltage is generated, the input voltage of the inverter Ic1 is higher than the threshold voltage Vth0 of the inverter Ic1, because of which the output of the inverter Ic1 is at the L level.

Meanwhile, when a positive offset voltage (+a(mV)) is sampled when in the sampling mode, the capacitor C1 is charged by the offset voltage (a(mV)), with the potential Va as a reference, while the capacitor C2 is charged by the threshold voltage Vth0 of the inverter Ic1.

Consequently, when the capacitors C1 and C2 are connected in series in a state wherein a positive offset voltage is generated, the input voltage of the inverter Ic1 is lower than the threshold voltage Vth0 of the inverter Ic1, because of which the output of the inverter Ic1 is at the H level.

Therefore, the polarity of the offset voltage can be determined from the H and L level output signals of the inverter Ic1.

Herein, offset voltage polarity determination will be described. When determining whether offset voltage is positive or negative, the use of a part such as a two input terminal comparator can also be considered.

In this case, polarity determination from the input voltage differential is carried by the gate of the differential pair transistor M2 being connected to one input terminal of the comparator, while the gate of the differential pair transistor M3 is connected to the other input terminal.

Note that as the comparator is also of a differential pair type, offset voltage (referred to as offset voltage B) exists. Consequently, in order to accurately measure the offset voltage (referred to as offset voltage A) generated in the differential amplification circuit of the measurement target, including the differential pair transistors M2 and M3, it is necessary to prepare a comparator that has offset voltage B lower than the offset voltage A.

In this case, however, a contradiction arises in that it is sufficient to use the differential amplification portion forming the comparator as the differential pair transistors M2 and M3 of the differential amplification circuit of the measurement target.

Consequently, the invention is such that, rather than using a differential pair type comparator as an offset voltage polarity determination unit, the contradiction is resolved by using passive elements, those being the inverter Ic1 and the two capacitors C1 and C2. Also, offset voltage polarity determination can be carried out accurately using the kind of polarity determination unit configuration of the invention.

Next, a description will be given of offset voltage correction amount weighting. FIG. 13 is a diagram showing an example of offset voltage correction amount weighting. The items in a table T1 are the adjustment data bits trim(1) to trim(6) and the offset voltage correction amount.

The table T1 shows the amount by which the offset voltage can be corrected by the current drive capacities of the current sources I1 to I6 being added by enabling by the adjustment data bits trim(1) to trim(6).

Herein, when a negative offset voltage is generated, correction is carried out in a direction causing the offset voltage to rise in a positive direction in order to reduce the negative offset voltage. Also, when a negative offset voltage is generated, that is, in a state wherein feedback is applied and a negative offset voltage is output, the currents flowing through the differential pair transistors M2 and M3 are equal, so that $I_{M2}=I_{M3}$.

Meanwhile, in a state wherein the offset voltage is corrected, that is, in a state wherein the gate-to-source voltages of the transistors M2 and M3 are equal, the unbalanced state of the currents flowing through the transistors M2 and M3 is such that $I_{M2}<I_{M3}$.

Consequently, in order to cause the offset voltage to rise, the current drive capacity of the active load connected to the differential pair transistor M3 is raised, and control is carried out so that the current flowing through the whole of the active load and the current $I_{M3}$ are equal.

For example, Table T1 shows that when the adjustment data bit trim(4) is turned on, offset voltage correction wherein the offset voltage correction amount is +1 (mV) is carried out.

When the adjustment data bit trim(4) is turned on, thereby causing the switch SW4 to be turned on, the gate voltage of the transistor M7 drops owing to the current drive capacity of the current source I4 being added to the current drive capacity of the transistor M5 of the active load connected to the transistor M3, and the OUT terminal voltage rises. In this case, correction rising 1 (mV) in the positive direction from the current offset voltage is carried out by the addition of the current drive capacity of the current source I4.

Also, Table T1 shows that when the adjustment data bit trim(5) is turned on, offset voltage correction wherein the offset voltage correction amount is +2 (mV) is carried out.

When the adjustment data bit trim(5) is turned on, thereby causing the switch SW5 to be turned on, the gate voltage of the transistor M7 drops owing to the current drive capacity of the current source I5 being added to the current drive capacity of the transistor M5 of the active load connected to the transistor M3, and the OUT terminal voltage rises.

In this case, correction rising 2 (mV) in the positive direction from the current offset voltage is carried out by the addition of the current drive capacity of the current source I5.

Furthermore, Table T1 shows that when the adjustment data bit trim(6) is turned on, offset voltage correction wherein the offset voltage correction amount is +4 (mV) is carried out.

When the adjustment data bit trim(6) is turned on, thereby causing the switch SW6 to be turned on, the gate voltage of the transistor M7 drops owing to the current drive capacity of the current source I6 being added to the current drive capacity of the transistor M5 of the active load connected to the transistor M3, and the OUT terminal voltage rises.

In this case, correction rising 4 (mV) in the positive direction from the current offset voltage is carried out by the addition of the current drive capacity of the current source I6.

Consequently, in this example, when a negative offset voltage is generated, correction causing a rise of a maximum of +7 (mV) from the current offset voltage can be carried out provided that all of the adjustment data bits trim(4) to trim(6) are turned on.

Meanwhile, when a positive offset voltage is generated, correction is carried out in a direction causing the offset voltage to fall in a negative direction in order to reduce the positive offset voltage. Also, when a positive offset voltage is generated, that is, in a state wherein feedback is applied and a positive offset voltage is output, the currents flowing through the differential pair transistors M2 and M3 are equal, so that $I_{M3}=I_{M2}$.

Meanwhile, in a state wherein the offset voltage is corrected, that is, in a state wherein the gate-to-source voltages of the transistors M2 and M3 are equal, the unbalanced state of the currents flowing through the transistors M2 and M3 is such that $I_{M2}>I_{M3}$.

Consequently, in order to cause the offset voltage to fall, control is carried out so that the gate voltage of the transistor M7 rises, and the OUT terminal voltage drops, by the gate voltages of the transistors M4 and M5 being lowered, and the drive capacity of M5 being lowered, by the current drive capacity of the active load connected to the transistor M2 being raised.

For example, Table T1 shows that when the adjustment data bit trim(1) is turned on, offset voltage correction wherein the offset voltage correction amount is −1 (mV) is carried out.

When the adjustment data bit trim(1) is turned on, thereby causing the switch SW1 to be turned on, the current drive capacity of the current source I1 is added to the current drive capacity of the transistor M4 of the active load connected to the transistor M2, the gate voltages of the transistors M4 and M5 drop, and the drive capacity of M5 drops, whereby the gate voltage of the transistor M7 rises, and the OUT terminal voltage drops.

In this case, correction falling 1 (mV) in the negative direction from the current offset voltage is carried out by the addition of the current drive capacity of the current source I1.

Also, Table T1 shows that when the adjustment data bit trim(2) is turned on, offset voltage correction wherein the offset voltage correction amount is −2 (mV) is carried out.

When the adjustment data bit trim(2) is turned on, thereby causing the switch SW2 to be turned on, the current drive capacity of the current source I2 is added to the current drive capacity of the transistor M4 of the active load connected to the transistor M2, the gate voltages of the transistors M4 and M5 drop, and the drive capacity of M5 drops, whereby the gate voltage of the transistor M7 rises, and the OUT terminal voltage drops.

In this case, correction falling 2 (mV) in the negative direction from the current offset voltage is carried out by the addition of the current drive capacity of the current source I2.

Also, Table T1 shows that when the adjustment data bit trim(3) is turned on, offset voltage correction wherein the offset voltage correction amount is −4 (mV) is carried out.

When the adjustment data bit trim(3) is turned on, thereby causing the switch SW3 to be turned on, the current drive capacity of the current source I3 is added to the current drive capacity of the transistor M4 of the active load connected to the transistor M2, the gate voltages of the transistors M4 and M5 drop, and the drive capacity of M5 drops, whereby the gate voltage of the transistor M7 rises, and the OUT terminal voltage drops.

In this case, correction falling 4 (mV) in the negative direction from the current offset voltage is carried out by the addition of the current drive capacity of the current source I3.

Consequently, in this example, when a positive offset voltage is generated, correction causing a fall of a maximum of −7 (mV) from the current offset voltage can be carried out provided that all of the adjustment data bits trim(1) to trim(3) are turned on.

The heretofore described kind of offset voltage correction amount weighting can be realized by changing, for example, the sizes (W/L, where W is the gate width and L is the gate length) of the transistors functioning as the current sources I1 to I6.

Next, the operation of maintaining the reduced state of the offset voltage by switching between the sampling mode and correction mode will be described in more detail, using a timing chart.

Figure 14:
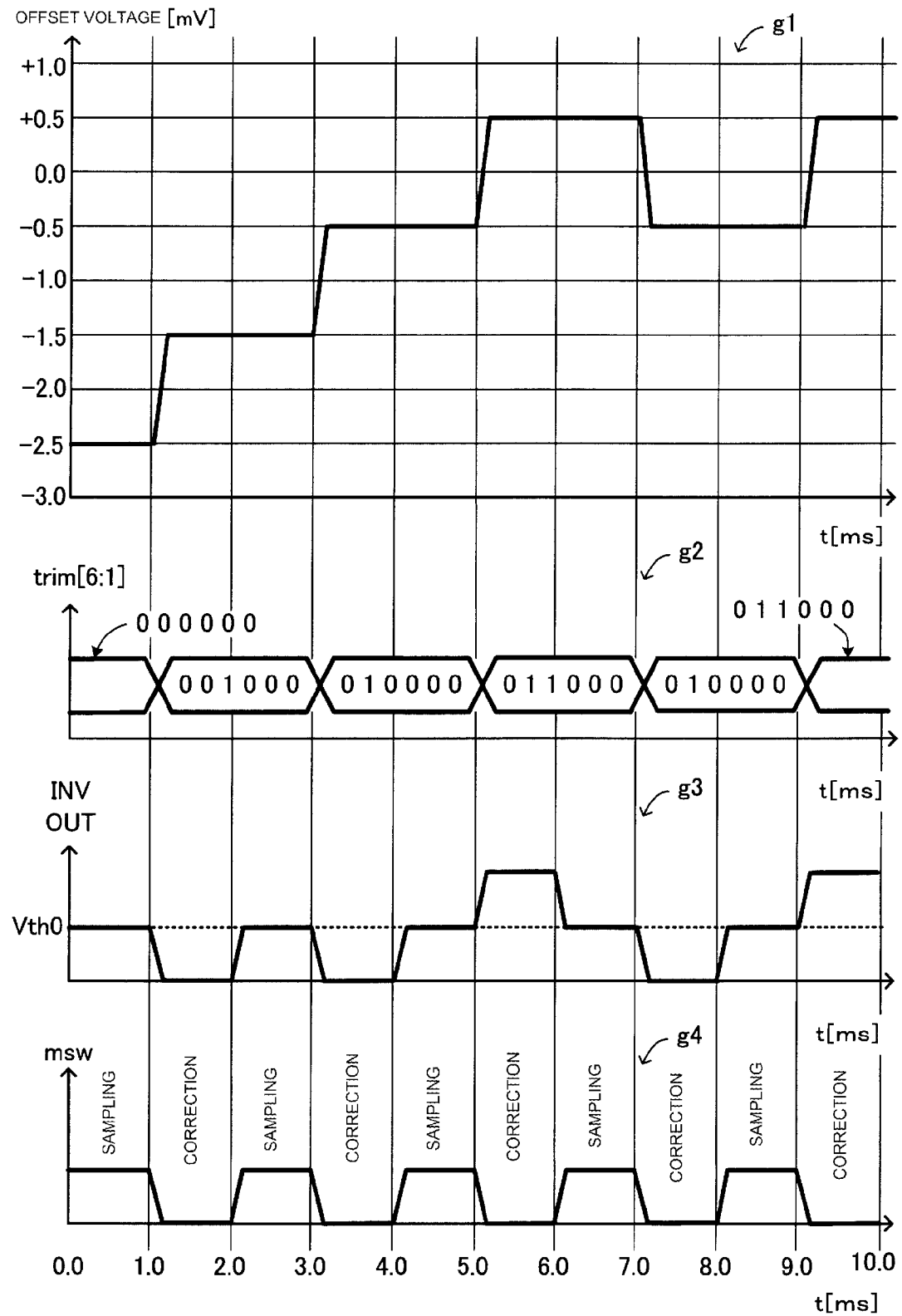
FIG. 14 is a timing chart showing an offset voltage correction operation.

FIG. 14 is a timing chart showing an offset voltage correction operation. Graph g1 shows an offset voltage waveform, wherein the vertical axis is voltage (mV), and the horizontal axis is time t(ms).

Graph g2 shows data values of the adjustment data bus "trim" (6:1), wherein the vertical axis is voltage (mV), and the horizontal axis is time t(ms). The data value of the adjustment data bus "trim" (6:1) changes in 2 (ms) cycles.

Graph g3 shows an output signal level INV OUT of the inverter Ic1, wherein the vertical axis is voltage (mV), and the horizontal axis is time t(ms).

Graph g4 shows a waveform of the mode switching signal msw, wherein the vertical axis is voltage, and the horizontal axis is time t(ms). The mode switching signal msw is of a cycle the same as that of the clock output from the clock generator 13, and in this example, switches between the H level and L level at 1 (ms) intervals.

In the following description, it is assumed that the offset voltage correction amount when each of the current sources I1 to I6 is driven is based on the value shown in Table T1 of FIG. 13.

Also, it is assumed that in the initial state of the amplifying device 10a, the threshold voltage of the transistor M2 is 2.5 mV lower than the threshold voltage of the transistor M3 due to a difference between the characteristics of the differential pair transistors M2 and M3 (VthM2=−|Vth0|−2.5 (mV), VthM3=−|Vth0|(mV)). That is, it is assumed that a negative offset voltage of −2.5 (mV) is generated in the initial state.

As the mode switching signal msw when $0.0 \le t < 1.0$ is at the H level, the operating mode is the sampling mode. When in the sampling mode, the output of the inverter Ic1 is the threshold voltage Vth0. Also, the offset voltage of −2.5 (mV) is sampled in the sampling mode.

The adjustment data bus "trim" (6:1) output from the logic control circuit 14 is output at 000000b as an initial value, turning off the switches SW1 to SW6.

As the mode switching signal msw when 1.0≤t<2.0 is at the L level, the operating mode is the correction mode. The offset voltage of −2.5 (mV) has been sampled in the sampling mode a half-cycle previously when 0.0≤t<1.0.

When the offset voltage is negative, the output of the inverter Ic1 is at the L level, as heretofore described. Consequently, an L level level signal is input from the inverter Ic1 into the logic control circuit 14 in the correction mode, because of which the logic control circuit 14 recognizes that a negative offset voltage is being generated.

In the logic control circuit 14, correction is carried out so as to raise the offset voltage from negative in a positive direction in order to reduce the negative offset voltage. Herein, the logic control circuit 14 turns on only the adjustment data bit trim(4).

That is, one clock cycle's worth of 001000b is output from the adjustment data bus "trim" (6:1) (one clock cycle is 2 (ms)), thereby turning on the switch SW4. The on/off states of all the switches are such that SW1, SW2, SW3, SW4, SW5, and SW6 are off, off, off, on, off, and off respectively.

By the switch SW4 being turned on, and the current drive capacity of the current source I4 being added to the current drive capacity of the transistor M5, the offset voltage rises 1 (mV) based on the weighting setting of Table T1. Consequently, the offset voltage becomes −1.5 (=−2.5+1) (mV).

When 2.0≤t<3.0, the operating mode is the sampling mode, and the output of the inverter Ic1 is the threshold voltage Vth0. The offset voltage of −1.5 (mV) is sampled in the sampling mode.

When 3.0≤t<4.0, the operating mode is the correction mode. The offset voltage of −1.5 (mV) has been sampled in the sampling mode a half-cycle previously when 2.0≤t<3.0.

Consequently, the output of the inverter Ic1 is at the L level in the correction mode, and the logic control circuit recognizes that a negative offset voltage is being generated.

As the offset voltage does not change from negative in a positive direction even though the adjustment data bit trim (4) is turned on, the logic control circuit 14 turns off the adjustment data bit trim (4), and turns on the adjustment data bit trim (5), which has a larger correction amount, instead.

That is, the logic control circuit 14 outputs one clock cycle's worth of 010000b from the adjustment data bus "trim" (6:1), thereby turning on only the switch SW5. The on/off states of all the switches are such that SW1, SW2, SW3, SW4, SW5, and SW6 are off, off, off, off, on, and off respectively.

The switch SW5 is turned on in the state wherein the initial offset voltage is −2.5 (mV), when the switch SW4 is turned off. Consequently, the current drive capacity of the current source I5 is added to the current drive capacity of the transistor M5, and the offset voltage rises 2 (mV) based on the weighting setting of Table T1. Therefore, the offset voltage becomes −0.5 (=−2.5+2) (mV).

When 4.0≤t<5.0, the operating mode is the sampling mode, and the output of the inverter Ic1 is the threshold voltage Vth0. The offset voltage of −0.5 (mV) is sampled in the sampling mode.

When 5.0≤t<6.0, the operating mode is the correction mode. The offset voltage of −0.5 (mV) has been sampled in the sampling mode a half-cycle previously when 4.0≤t<5.0.

Consequently, the output of the inverter Ic1 is at the L level in the correction mode, and the logic control circuit recognizes that a negative offset voltage is being generated.

As the offset voltage does not change from negative in a positive direction even though the adjustment data bit trim (5) is turned on, the logic control circuit 14 turns on both the adjustment data bit trim (4) and adjustment data bit trim (5) in order to increase the correction amount.

That is, the logic control circuit 14 outputs one clock cycle's worth of 011000b from the adjustment data bus "trim" (6:1), thereby turning on the switches SW4 and SW5. The on/off states of all the switches are such that SW1, SW2, SW3, SW4, SW5, and SW6 are off, off, off, on, on, and off respectively.

The switch SW4 is also turned on in the state wherein the offset voltage is −0.5 (mV), when the switch SW5 is in an on-state. The current drive capacity of the current source I4 is also added, in addition to the current drive capacity of the transistor M5 and the current drive capacity of the current source I5. Consequently, the offset voltage rises 1 (mV) based on the weighting setting of Table T1. Therefore, the offset voltage becomes +0.5 (=−0.5+1) (mV).

When 6.0≤t<7.0, the operating mode is the sampling mode, and the output of the inverter Ic1 is the threshold voltage Vth0. The offset voltage of +0.5 (mV) is sampled in the sampling mode.

When 7.0≤t<8.0, the operating mode is the correction mode. The offset voltage of +0.5 (mV) has been sampled in the sampling mode a half-cycle previously when 6.0≤t<7.0.

When the offset voltage is positive, the output of the inverter Ic1 is at the H level, as heretofore described. Consequently, an H level level signal is input from the inverter Ic1 into the logic control circuit 14 in the correction mode, because of which the logic control circuit 14 recognizes that a positive offset voltage is being generated.

In the logic control circuit 14, correction is carried out so that the offset voltage decreases from positive to negative in order to reduce the positive offset voltage. Herein, the logic control circuit 14 leaves the adjustment data bit trim (5) in an on-state, and turns off the adjustment data bit trim (4).

That is, the logic control circuit 14 outputs one clock cycle's worth of 010000b from the adjustment data bus "trim" (6:1), thereby turning on only the switch SW5. The on/off states of all the switches are such that SW1, SW2, SW3, SW4, SW5, and SW6 are off, off, off, off, on, and off respectively.

By leaving the switch SW5 in an on-state and turning off the switch SW4 in the state wherein the offset voltage is +0.5 (mV), when the switches SW4 and SW5 had been in an on-state, the current drive capacity of the current source I4 is removed, and the state becomes such that only the current drive capacity of the current source I5 is added.

Consequently, the offset voltage drops 1 (mV) based on the weighting setting of Table T1, because of which the offset voltage becomes −0.5 (=−0.5−1) (mV).

When 8.0≤t<9.0, the operating mode is the sampling mode, and the output of the inverter Ic1 is the threshold voltage Vth0. The offset voltage of −0.5 (mV) is sampled in the sampling mode.

When 9.0≤t<10.0, the operating mode is the correction mode. The offset voltage of −0.5 (mV) has been sampled in the sampling mode a half-cycle previously when 8.0≤t<9.0.

Consequently, the output of the inverter Ic1 is at the L level in the correction mode, and the logic control circuit recognizes that a negative offset voltage is being generated.

In the logic control circuit 14, correction is carried out so that the offset voltage rises from negative to positive in order to reduce the negative offset voltage. Herein, the logic control circuit 14 turns on the adjustment data bit trim (4) again.

That is, the logic control circuit 14 outputs one clock cycle's worth of 011000b from the adjustment data bus "trim" (6:1), thereby turning on both of the switches SW4 and SW5. The on/off states of all the switches are such that SW1, SW2, SW3, SW4, SW5, and SW6 are off, off, off, on, on, and off respectively.

By leaving the switch SW5 in an on-state and turning on the switch SW4 again in the state wherein the offset voltage is −0.5 (mV), when the switch SW5 had been in an on-state, the current drive capacity of the current source I4 is also added.

Consequently, the offset voltage rises 1 (mV) based on the weighting setting of Table T1, because of which the offset voltage becomes +0.5 (=−0.5+1) (mV).

Hereafter, by the heretofore described kind of offset voltage correction control being carried out, the offset voltage, centered on 0(V), alternately and repeatedly switches between a positive offset voltage of +0.5 (mV) and a negative offset voltage of −0.5 (mV) every other clock cycle.

To concisely summarize the offset voltage correction control, the adjustment data bus "trim" (6:1) starts from 000000b, and firstly, correction of 1 mV is carried out with respect to the initial state offset voltage, with the adjustment data bus "trim" (6:1) at 001000b.

Subsequently, with the adjustment data bus "trim" (6:1) at 010000b, correction of 2 mV is carried out with respect to the initial state offset voltage, and furthermore, with the adjustment data bus "trim" (6:1) at 011000b, correction of 3 mV is carried out with respect to the initial state offset voltage. In this way, the correction amount is gradually raised until a negative offset voltage reaches a positive offset voltage.

Then, the offset voltage becoming positive when correcting by 3 mV, the polarity of the offset voltage has reversed, because of which correction of 2 mV is carried out next with the adjustment data bus "trim" (6:1) at 010000b. Thereupon, as the polarity reverses again, the operating order is such that correction of 3 mV is carried out next with the adjustment data bus "trim" (6:1) at 011000b.

Figure 15:
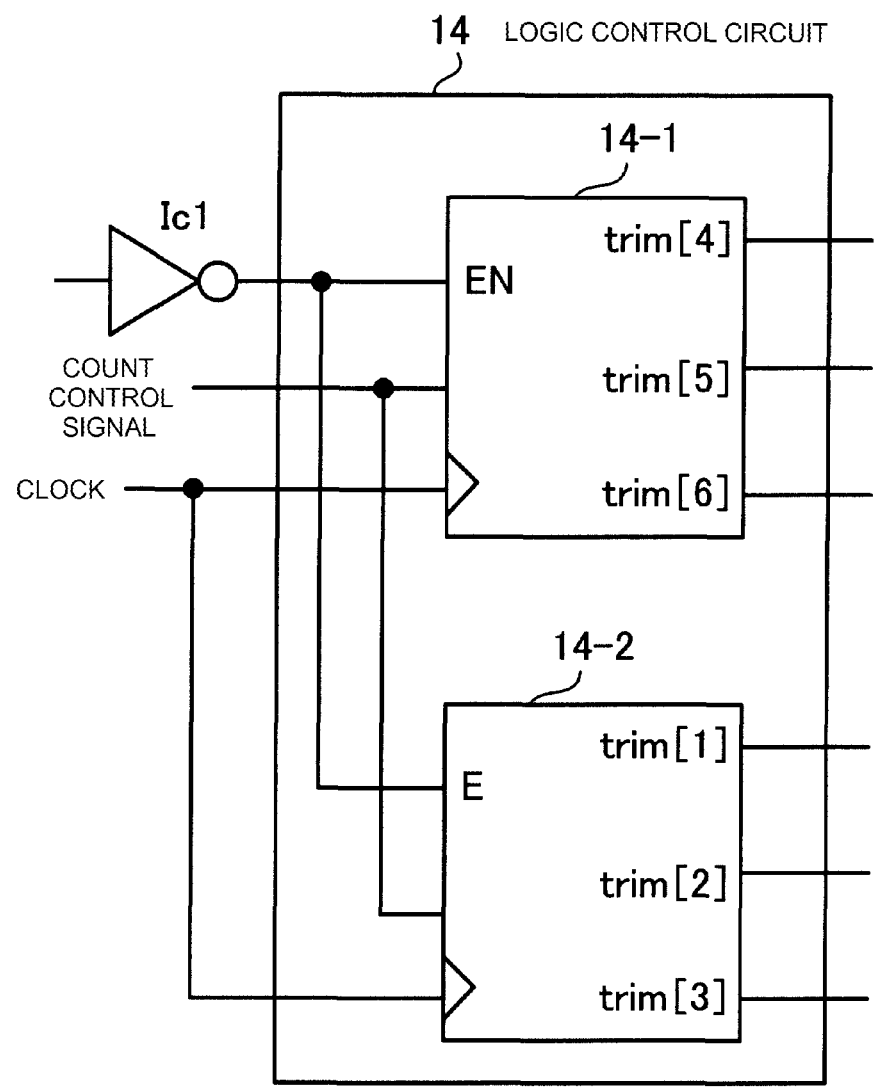
FIG. 15 is a diagram showing an internal configuration example of the logic control circuit.

Next, an internal configuration of the logic control circuit 14 will be described. FIG. 15 is a diagram showing an internal configuration example of the logic control circuit. FIG. 15 shows an internal configuration example of the portion that outputs the adjustment data bus "trim" (6:1) based on the input of the inverter Ic1.

The logic control circuit 14 includes octal up/down counters 14-1 and 14-2. The output terminal of the inverter Ic1 is connected to an enable terminal EN of the counter 14-1 and an enable terminal E of the counter 14-2. Also, a clock from the clock generator 13 is input into the counters 14-1 and 14-2.

Furthermore, a count control signal that controls an up-count (rising order) or down-count (descending order) is input into the counters 14-1 and 14-2 (the count control signal may be generated in a logic circuit, or may be provided from a programmable logic device (PLD) or the like).

The counter 14-1 outputs the adjustment data bits trim(4) to trim(6). The counter 14-2 outputs the adjustment data bits trim(1) to trim(3).

The enable terminal EN is active-low (drives at the L level), while the enable terminal E is active-high (drives at the H level).

Herein, when a negative offset voltage is generated, the output of the inverter Ic1 is at the L level, because of which the counter 14-1 becomes active, and drives based on the input clock. At this time, the counter 14-2 is inactive.

Herein, when a positive offset voltage is generated, the output of the inverter Ic1 is at the H level, because of which the counter 14-2 becomes active, and drives based on the input clock. At this time, the counter 14-1 is inactive.

Figure 16:
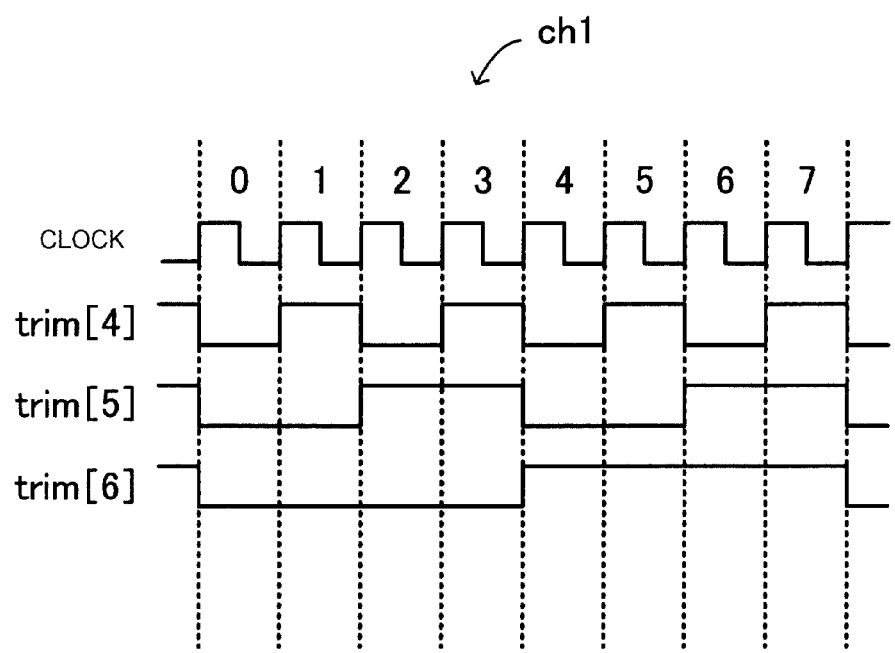
FIG. 16 is timing charts showing operations of counters.
Figure 16:
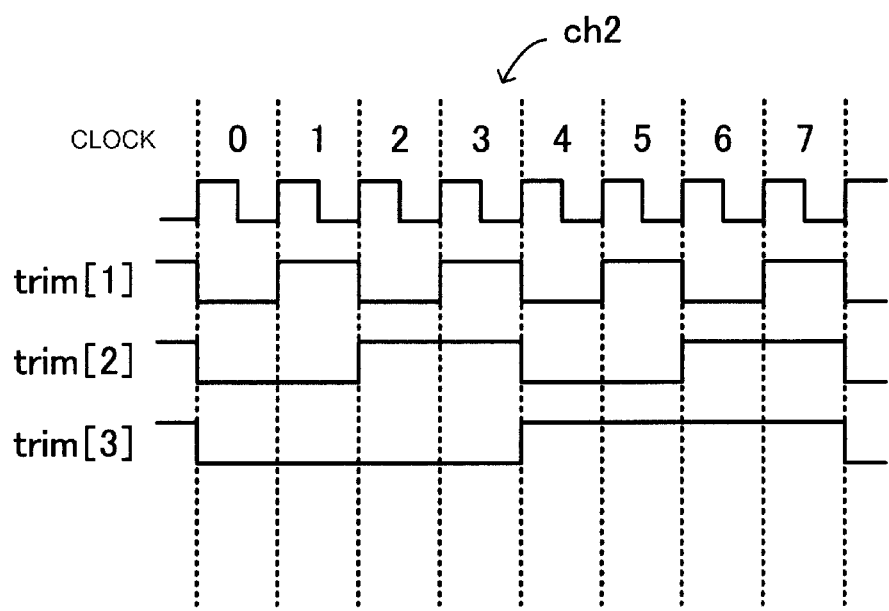

FIG. 16 is timing charts showing operations of the counters. A timing chart ch1 shows an operation of the counter 14-1 wherein, when there is a negative offset voltage, the counter 14-1 drives, outputting 000b to 111b with respect to trim(4) to trim(6).

Also, a timing chart ch2 shows an operation of the counter 14-2 wherein, when there is a positive offset voltage, the counter 14-2 drives, outputting 000b to 111b with respect to trim(1) to trim(3). The interior of the logic control circuit 14 can be configured of this kind of digital circuit.

Next, offset voltage smoothing will be described. As heretofore described, offset voltage output from the output terminal OUT of the amplifying device 10 alternately and repeatedly switches between a positive offset voltage and a negative offset voltage, centered on 0(V), every other clock cycle.

Even though positive and negative appear alternately, both positive and negative offset voltages are reduced to within the range of the specifications, because of which it can be said that there are few situations under normal use in which any notable inconvenience occurs.

However, as there is also the possibility of an offset voltage signal whose polarity changes between positive and negative being superimposed on an original amplification output signal of the amplifying device 10, or on another transmission signal, and causing noise, it is preferable that offset voltage of alternating polarity is smoothed.

Figure 17:
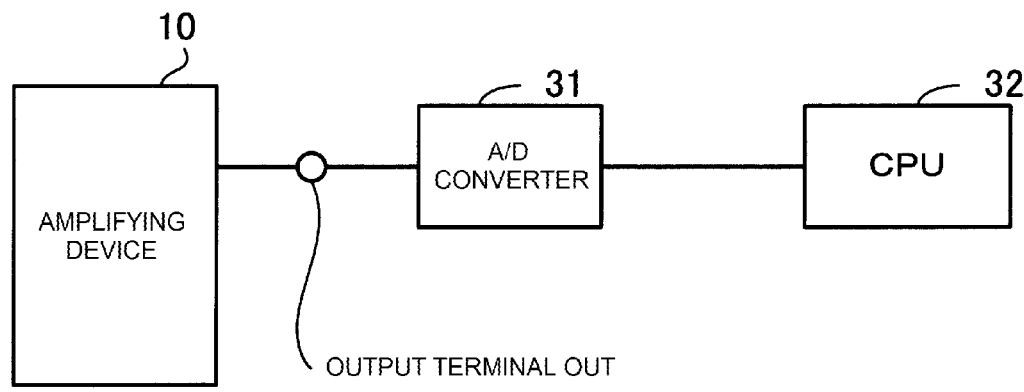
FIG. 17 is a diagram showing smoothing of the output of an amplifying device.
Figure 18:
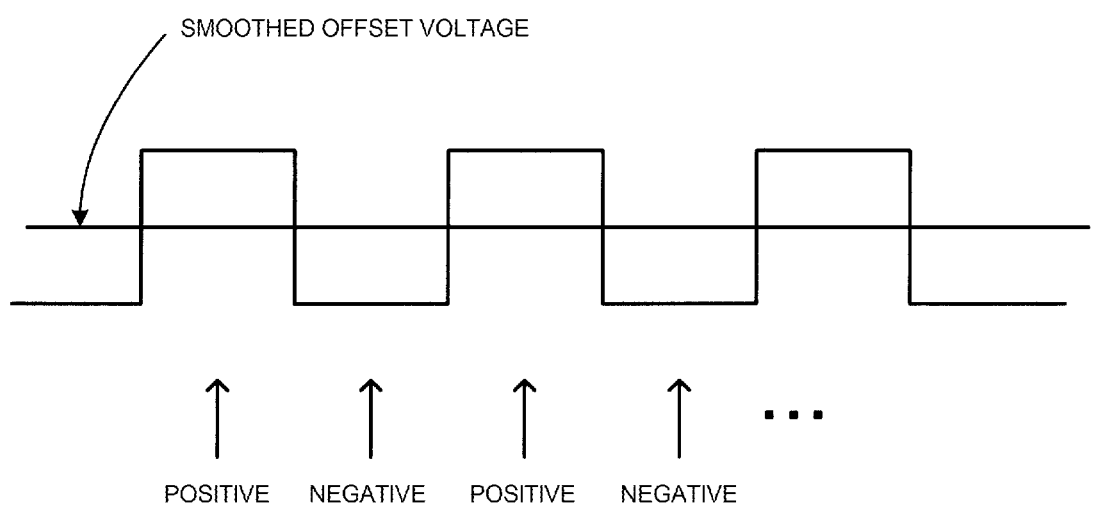
FIG. 18 is a diagram showing smoothing of the output of an amplifying device.

FIGS. 17 and 18 are diagrams showing smoothing of the output of the amplifying device. In FIG. 17, an A/D converter 31 is connected to the output terminal OUT of the amplifying device 10, and a central processing unit (CPU) 32 is connected to the output terminal of the A/D converter 31.

The A/D converter 31 converts an analog output signal from the amplifying device 10 into a digital signal, and outputs the digital signal to the CPU 32.

FIG. 18 shows a smoothing process. FIG. 18 shows a state wherein offset voltage of alternating polarity is output from the amplifying device 10, and sampled by the A/D converter 31.

The A/D converter 31 sequentially samples the offset voltage of alternating polarity in positions wherein the polarity is positive, negative, positive, negative, and so on.

By sampling in this kind of sampling cycle, smoothing can be carried out by averaging the positive and negative values of the offset voltage, and generating a direct current component. By so doing, offset voltage of alternating polarity can be prevented from causing noise to occur.

As heretofore described, the offset voltage correction control of the invention is such that a sampling mode and correction mode are alternately repeated. In the sampling mode, an offset voltage Voffset is sampled in the capacitor C1, while the threshold voltage Vth0 of the inverter Ic1 is sampled in the capacitor C2.

Also, in the correction mode, the capacitor C1 and capacitor C2 are connected in series, and connected to the input of the inverter Ic1. At this time, the input voltage of the inverter Ic1 is Vth0+Voffset, but when the offset voltage Voffset is negative, the output of the inverter Ic1 is at the L level, while when the offset voltage Voffset is positive, the output of the inverter Ic1 is at the H level. Therefore, the polarity of the offset voltage can be recognized from the H or L output level from the inverter Ic1.

Meanwhile, when a negative offset voltage is sampled in the sampling mode, the logic control circuit 14 controls the offset voltage correction circuit 15 so as to correct the offset voltage by one step to the positive side in the correction mode.

Also, when a positive offset voltage is sampled in the sampling mode, the logic control circuit 14 controls the offset voltage correction circuit 15 so as to correct the offset voltage by one step to the negative side in the correction mode. As a step is of 1 (mV) in the heretofore described example, correction is carried out in units of 1 (mV).

Then, offset voltage polarity is determined in the same way in the next sampling mode too, and the offset voltage correction circuit 15 is controlled in the same way in the next correction mode too.

When continuing this kind of control, the offset voltage polarity inverts at the point at which the offset voltage correction amount exceeds the original offset voltage, provided that the original offset voltage is within the correction range. When the offset voltage inverts, for example, from negative to positive, the next correction is to the negative side, as a result of which the offset voltage becomes negative.

That is, the offset voltage polarity inverts alternately in the order of positive→negative→positive→negative, centered on 0V, and the absolute value of the offset voltage in this state is a low value equivalent to one step or less of the offset voltage correction amount.

Also, this kind of offset voltage correction control operates continuously while the amplifying device 10 is operating. Therefore, even when the offset voltage varies due to, for example, temperature fluctuation or power supply voltage fluctuation occurring as environmental fluctuation, correction continues to be executed every time, because of which a constantly low offset voltage can be maintained with high accuracy.

Heretofore, embodiments have been given as examples, but the configuration of each portion shown in the embodiments can be replaced by another configuration having the same function. Also, other optional components or steps may be added.

What is claimed is:

1. An amplifying device, comprising:
    a differential amplification unit having differential pair transistors and amplifying a difference between input voltages;
    an offset voltage measurement unit that samples offset voltage generated due to an imbalance in current drive capacities of the differential pair transistors in a first mode and determines a polarity of the sampled offset voltage in a second mode;
    a control unit that switches an operating mode between the first mode and the second mode, and outputs a control signal for correcting the offset voltage in accordance with a polarity determination result when in the second mode; and
    an offset voltage correction unit that corrects the offset voltage based on the control signal.

2. The amplifying device according to claim 1, wherein the offset voltage measurement unit includes a first sampling unit, a second sampling unit, a logic element, and a plurality of mode switching switches,
    the operating mode switches in accordance with an operating mode switch from the control unit to cause the first mode and the second mode to switch in constant cycles,
    the first sampling unit samples the offset voltage and the second sampling unit samples a threshold voltage of the logic element in the first mode, and
    the logic element outputs a level signal in accordance with the polarity of the sampled offset voltage, based on the sampled offset voltage and threshold voltage, in the second mode.

3. The amplifying device according to claim 2, wherein the first sampling unit is a first capacitor, the second sampling unit is a second capacitor, and the logic element is an inverter element,
    the first mode is such that
    a first terminal of the first capacitor is connected to a gate of a first transistor forming the differential pair transistors, a second terminal of the first capacitor is connected to a gate of a second transistor forming the differential pair transistors, a first terminal of the second capacitor is connected to an input terminal of the inverter element and an output terminal, and a second terminal of the second capacitor is connected to GND, and
    the second mode is such that
    a first terminal of the first capacitor is connected to an input terminal of the inverter element, the second terminal of the first capacitor is connected to the first terminal of the second capacitor, an output terminal of the inverter element is connected to an input terminal of the control unit, and the second terminal of the second capacitor is connected to GND.

4. The amplifying device according to claim 1, wherein the offset voltage correction unit includes a plurality of current sources connected in parallel to an active load of the differential pair transistors and a plurality of drive switches for driving the current sources,
    turns the drive switches on and off based on the control signal to connect the current sources to the active load, and gradually carries out correction of the offset voltage in steps of constant voltage.

5. The amplifying device according to claim 4, wherein the current sources have current drive capacities corresponding to weighting of an amount by which the offset voltage is corrected.

6. An offset voltage correction method of correcting an offset voltage of an amplifying device having differential pair transistors and amplifying a difference between input voltages, comprising:
    sampling an offset voltage generated due to an imbalance in current drive capacities of the differential pair transistors in a first mode;
    determining a polarity of the sampled offset voltage and outputting a control signal for correcting the sampled offset voltage in accordance with a polarity determination result in a second mode; and
    switching an operating mode between the first mode and the second mode, and correcting the sampled offset voltage based on the control signal.

7. An apparatus, comprising:
    a differential transistor pair including a first differential transistor and a second differential transistor;
    a sampling circuit switchably connectable to,
        in a sampling mode, the differential transistor pair to sample an offset voltage generated due to a difference between a characteristic of the first differential transistor and a characteristic of the second differential transistor, or in a correction mode, a polarity determination circuit configured to determine a polarity of the sampled offset voltage; and an offset voltage correction circuit configured to reduce the sampled offset voltage in the correction mode.

8. The apparatus of claim 7, further comprising a logic control circuit configured to output a mode switching signal to cause the apparatus to cyclically toggle between the sampling mode and the correction mode.

9. The apparatus of claim 8, wherein the sampling circuit includes a first capacitor, and is configured to, in response to the mode switching signal indicating the sampling mode, connect the first capacitor to the first differential transistor and the second differential transistor.

10. The apparatus of claim 9, wherein the polarity determination circuit includes an inverter and a second capacitor connected to ground, and is configured to, in response to the mode switching signal indicating the sampling mode, connect an input of the inverter to the second capacitor.

11. The apparatus of claim 10, wherein the sampling circuit and the polarity determination circuit are configured to, in response to the mode switching signal indicating the correction mode, connect the first capacitor to the second capacitor and to the input of the inverter.

12. The apparatus of claim 11, wherein the offset voltage correction circuit is configured to reduce an absolute value of the sampled offset voltage in the correction mode in response to an output signal of the inverter.

\* \* \* \* \*